United States Patent
Banno et al.

(10) Patent No.: US 7,560,308 B2
(45) Date of Patent: Jul. 14, 2009

(54) METHOD FOR MANUFACTURING BONDED SUBSTRATES AND SUBSTRATES FOR USE IN THE BONDED SUBSTRATES

(75) Inventors: Takaaki Banno, Nagoya (JP); Yuji Shinkai, Handa (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 111 days.

(21) Appl. No.: 11/390,479

(22) Filed: Mar. 28, 2006

(65) Prior Publication Data

US 2006/0226200 A1 Oct. 12, 2006

(30) Foreign Application Priority Data

Mar. 30, 2005 (JP) .............................. 2005-099566

(51) Int. Cl.
 *H01L 21/00* (2006.01)
(52) U.S. Cl. ................ 438/118; 438/613; 257/E23.069
(58) Field of Classification Search ................. 438/118, 438/613; 257/E23.069
See application file for complete search history.

(56) References Cited

U.S. PATENT DOCUMENTS 6,351,351 B1 2/2002 Takasugi
6,477,016 B1 * 11/2002 Yamaguchi et al. ...... 360/264.2
6,891,314 B2 5/2005 Sato et al.
2004/0113994 A1 6/2004 Shinkai

FOREIGN PATENT DOCUMENTS

EP 1403050 A1 3/2004
JP 2003069103 A 3/2003
JP 2004136663 A 5/2004

OTHER PUBLICATIONS

Communication (including European Search Report for European Patent Appl'n No. EP 06006116.5-2304 (counterpart to U.S. Appl. No. 11/390,479)), 8 pages, dated Jul. 14, 2006.

* cited by examiner

*Primary Examiner*—David A Zarneke
*Assistant Examiner*—Jenny L Wagner
(74) *Attorney, Agent, or Firm*—Baker Botts L.L.P.

(57) ABSTRACT

A method for manufacturing bonded substrates includes: forming the first terminals on the first substrate, the first terminals each having a metal core projecting from a surface of the first substrate, each metal core coated with a solder layer lower in a melting point than the metal core; forming the conductive second terminals on the second substrate; and electrically bonding the first terminals to the second terminals by heating the first and second substrates while applying pressure to the first substrate and the second substrate. In the forming of the first terminals, a ratio of a height of the metal core from the surface of the first substrate in a thickness direction of the first substrate to a thickness of the solder layer in the thickness direction of the first substrate is in a range of from 1:1 to 2:1.

8 Claims, 15 Drawing Sheets

US 7,560,308 B2

METHOD FOR MANUFACTURING BONDED SUBSTRATES AND SUBSTRATES FOR USE IN THE BONDED SUBSTRATES

CROSS-REFERENCE TO RELATED APPLICATIONS

This application is based upon and claims the benefit of priority from Japanese Patent Application No. 2005-99566 filed on Mar. 30, 2005, the entire contents of which are incorporated herein by reference.

BACKGROUND OF THE INVENTION

1. Field of the Invention

The invention relates to a method for manufacturing bonded substrates in which first terminals formed on a first substrate are bonded to second terminals formed on a second substrate, and a substrate for use in the bonded substrates.

2. Description of the Related Art

US 2004/113994 A discloses a method for manufacturing an inkjet head, including: transferring thermosetting epoxy-based resin (thermosetting adhesive) to a plurality of terminals (metal cores) having solder (solder layers) formed on their surfaces, and bonding the terminals to land portions (second terminals) formed on individual electrodes through the solder and the epoxy-based resin. For bonding the land portions to the terminals in this method for manufacturing an inkjet head, first, the terminals to which the epoxy-based resin has been transferred are pressed onto the land portions. In this event, the epoxy-based resin migrates to the peripheries of the land portions and the terminals, and is discharged from between the land portions and the terminals. Thus, the land portions, the terminals and the solder are surrounded by the epoxy-based resin. Next, the solder begins to melt due to heating, and the terminals approach the land portions. Then, the epoxy-based resin surrounding the land portions, the terminals and the solder is cured. When the solder is then cured, the terminals and the land portions are bonded so that they are electrically connected to each other. In this manner, the epoxy-based resin is located to surround the land portions, the terminals and the solder. Thus, the molten solder can be restrained from extending to the outside of the epoxy-based resin.

SUMMARY OF THE INVENTION

A result of researches made by the inventors shows, however, that according to the technique disclosed in US 2004/113994 A, some of a large number of solders formed on the surfaces of the terminals (metal cores) may not be electrically bonded to the land portions, depending on kinds of the solders and bonding conditions.

The invention provides a method for manufacturing bonded substrates, capable of electrically bonding first terminals and second terminals with high reliability, and a substrate for use in the bonded substrates.

According to one aspect of the invention, a method for manufacturing bonded substrates in which a plurality of first terminals formed on a first substrate are electrically bonded to a plurality of second terminals formed on a second substrate, includes: forming the first terminals on the first substrate, each of the first terminals having a metal core projecting from a surface of the first substrate, each metal core coated with a solder layer, the solder layer being lower in a melting point than the metal core; forming the conductive second terminals on the second substrate; and electrically bonding the first terminals to the second terminals by heating the first substrate and the second substrate while applying pressure to the first substrate and the second substrate. In the forming of the first terminals, a ratio of a height of the metal core from the surface of the first substrate in a thickness direction of the first substrate to a thickness of the solder layer in the thickness direction of the first substrate is in a range of from 1:1 to 2:1.

The present inventors carried out researches on the assumption that solder not electrically bonded with a land portion in the technique disclosed in US 2004/113994 A would be caused by some ratio of the height of a metal core to the thickness of the solder. As a result, the inventors found that since the ratio of the core height (30 μm) in design to the solder thickness (7-8 μm) in design in US 2004/113994 A is about 3.75:1 to 4.29:1 is very large, the variation range of actual core height and the variation range of actual sum of the core height and the solder layer thickness r overlap each other partially. That is, the inventors found that the maximum value of the actual core height is larger than the minimum value of the actual sum of the core height and the solder layer thickness. Due to occurrence of such a phenomenon, a land portion and solder may be not electrically bonded with each other according to the technique disclosed in US 2004/113994 A. In contrast, according to the above described method, the height of the metal core is set as a comparatively small value that is equal to or smaller than a value twice as large as the thickness of the solder layer. Accordingly, the variation range of the actual metal core height hardly overlaps the variation range of the actual sum of the metal core height and the solder layer thickness. That is, the maximum value of the actual metal core height is hardly larger than the minimum value of the actual sum of the metal core height and the solder layer thickness. It is therefore possible to electrically bond the first terminals and the second terminals with high reliability. In addition, there is no fear that the height of the metal core is smaller than the thickness of the solder layer. Accordingly, it is possible to prevent the adhesion between the metal core and the solder layer from lowering.

According to another aspect of the invention, a substrate includes a surface and a plurality of first terminals on the surface to be electrically bonded to a plurality of second terminals formed on another substrate. The first terminals are to be electrically bonded to a plurality of second terminals formed on another substrate. Each of the first terminals includes a metal core projecting from the surface. Each metal core is coated with a solder layer. The solder layer is lower in melting point than the metal core. A ratio of a height of the metal core from the surface in a thickness direction of the substrate to a thickness of the solder layer in the thickness direction of the substrate is in a range of from 1:1 to 2:1.

According to this configuration, the height of the metal core is set as a comparatively small value that is equal to or smaller than a value twice as large as the thickness of the solder layer. Accordingly, the variation range of the actual metal core height hardly overlaps the variation range of the actual sum of the metal core height and the solder layer thickness. That is, the maximum value of the actual metal core height is hardly larger than the minimum value of the actual sum of the metal core height and the solder layer thickness. It is therefore possible to electrically bond the first terminals and the second terminals with high reliability. In addition, there is no fear that the height of the metal core is smaller than the thickness of the solder layer. Accordingly, it is possible to prevent the adhesion between the metal core and the solder layer from lowering.

DETAILED DESCRIPTION OF EMBODIMENTS OF THE INVENTION

Embodiments of the invention will be described below with reference to the drawings.

Description will be made on an inkjet head having bonded substrates manufactured by a manufacturing method according to a first embodiment of the invention. Examples of a substrate according to this embodiment includes a circuit board mounted with electronic components, a substrate mounted with wires and terminals and a plate-like member having terminals to be bonded to the terminals of those substrates. A flexible printed circuit (FPC) 50 functioning as a first substrate and an actuator unit 21 functioning as a second substrate (both of them will be described later) are bonded to each other to form the bonded substrates.

Figure 1:
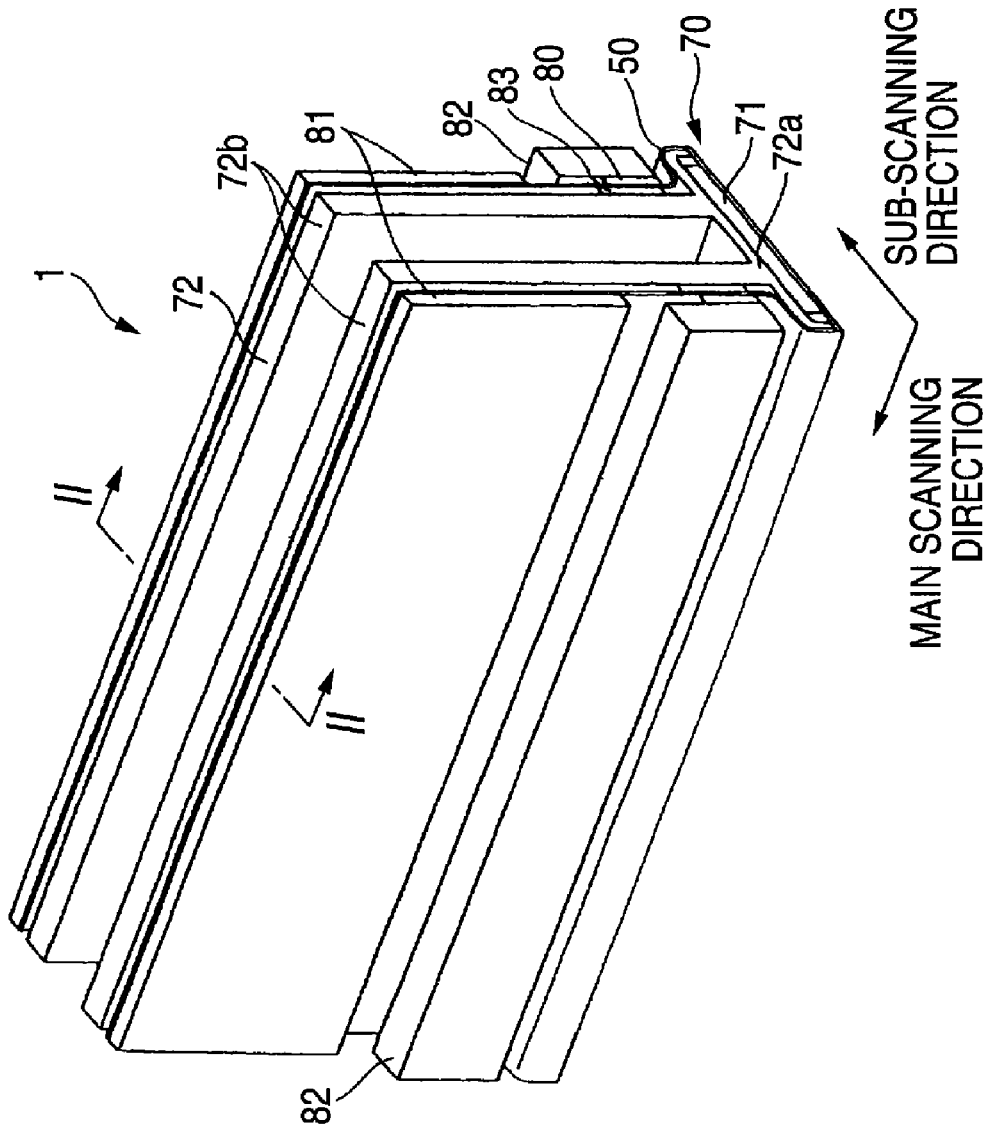
FIG. 1 is an outline perspective view of an inkjet head having bonded substrates manufactured by a manufacturing method according to a first embodiment of the invention.
Figure 2:
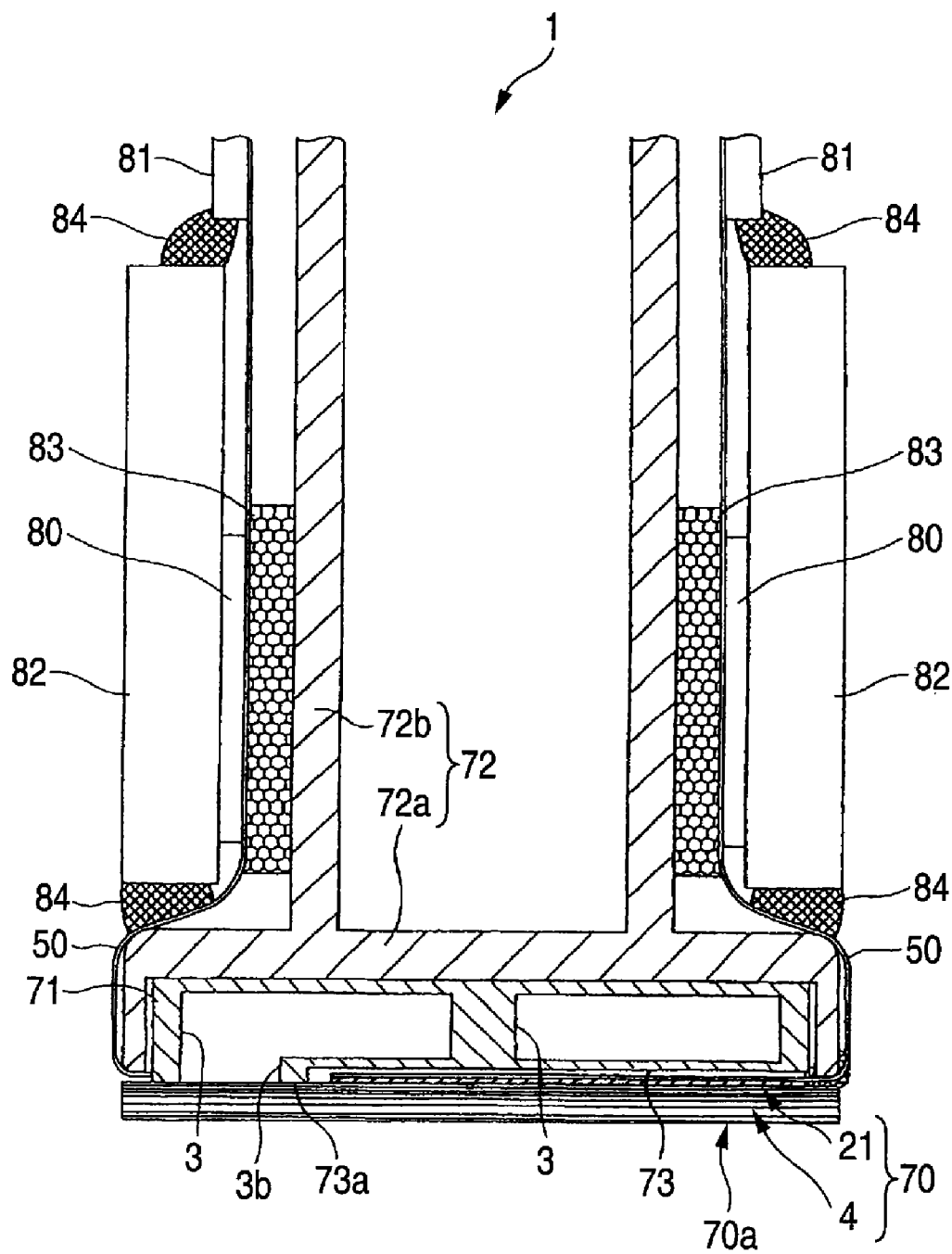
FIG. 2 is a sectional view taken along a line II-II in FIG. 1.

FIG. 1 is a perspective view showing the external appearance of an inkjet head having the aforementioned bonded substrates. FIG. 2 is a sectional view taken along a line II-II in FIG. 1. As shown in FIG. 1, an inkjet head 1 includes a head body 70 a base block 71 and the FPC 50. The head body 70 has a rectangular planar shape extending in a main scanning direction. The base block 71 is disposed above the head body 70 and has two ink reservoirs 3 formed therein. The FPC 50 is bonded to the upper surface of the head body 70.

The head body 70 includes a channel unit 4 in which ink channels are formed, and a plurality of actuator units 21 bonded to the upper surface of the channel unit 4 by a thermosetting adhesive, as shown in FIG. 2. The channel unit 4 has such a configuration that a plurality of thin sheets are laminated and bonded to one another. In addition, the bottom surface of the head body 70 is formed as an ink ejection surface 70a in which a large number of nozzles 8 (see FIG. 5) having very small diameters are formed. On the other hand, an FPC 50 having flexibility is bonded to the upper surface of each actuator unit 21, and withdrawn to left or right, while being bent and withdrawn upward in FIG. 2.

Figure 3:
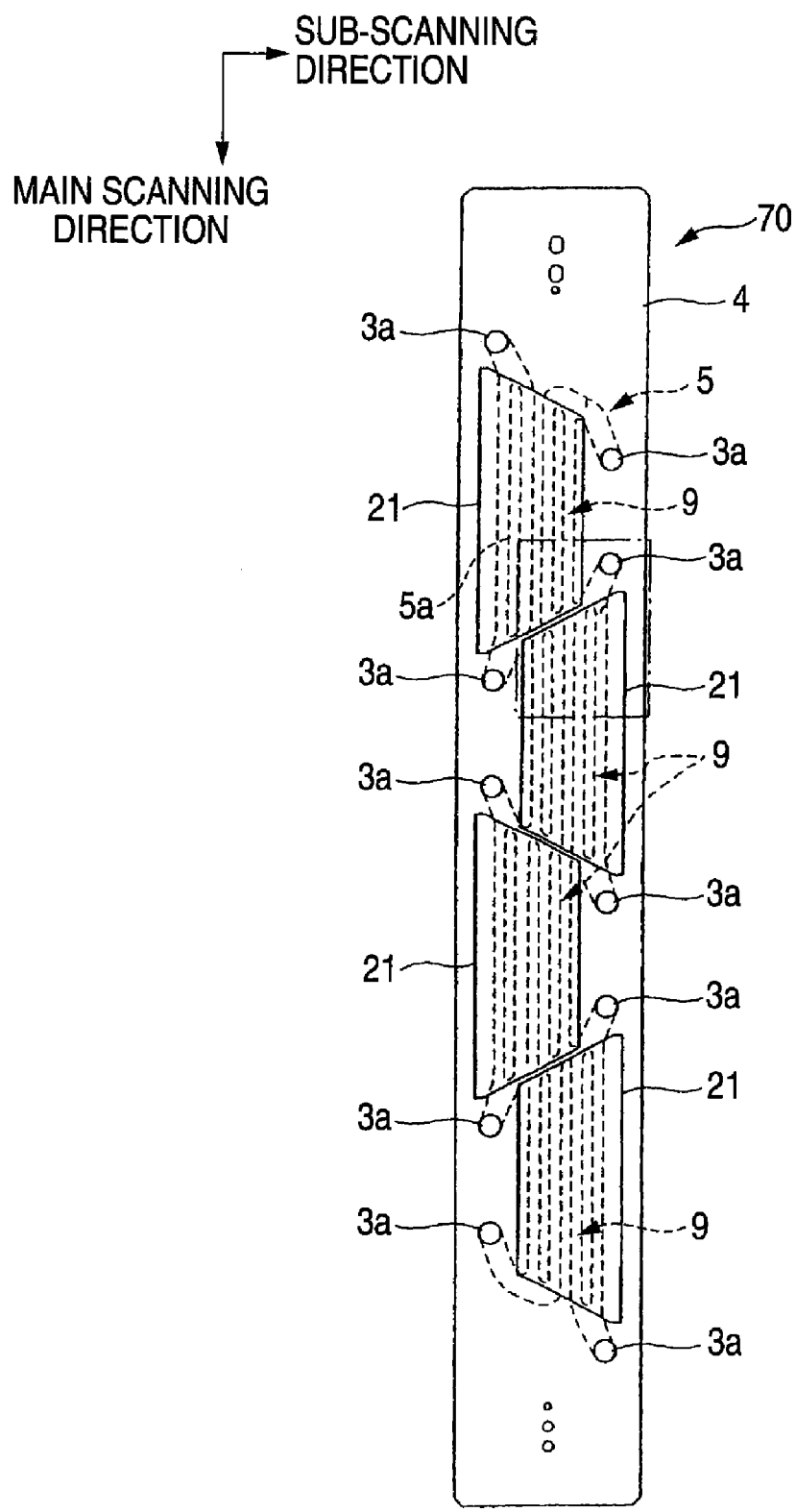
FIG. 3 is a plan view of a head body shown in FIG. 2, viewed from its top.

FIG. 3 is a plan view of the head body 70 viewed from its top. As shown in FIG. 3, the channel unit 4 has a rectangular planar shape extending in the main scanning direction. In FIG. 3, a manifold channel 5 provided in the channel unit 4 is depicted by broken lines. Ink is supplied from the ink reservoirs 3 of the base block 71 to the manifold channel 5 through a plurality of openings 3a. The manifold channel 5 branches into a plurality of sub-manifold channels 5a extending in parallel to the longitudinal direction (main scanning direction) of the channel unit 4.

Four actuator units 21 each having a trapezoidal planar shape are bonded to the upper surface of the channel unit 4. The four actuator units 21 are arrayed zigzag in two lines so as to avoid the openings 3a. Each actuator unit 21 is disposed so that its parallel opposite sides (upper and lower sides) extend in the longitudinal direction of the channel unit 4. The plurality of openings 3a are arrayed in two lines in the longitudinal direction of the channel unit 4 so that a total of ten openings 3a, that is, five in each line, are located not to interfere with the actuator units 21. Oblique sides of adjacent ones of the actuator units 21 overlap each other partially in the width direction (sub-scanning direction) of the channel unit 4.

In the ink ejection surface 70a, an ink ejection region where the large number of nozzles 8 are arrayed in a matrix is formed so as to correspond to each region where the actuator unit 21 is bonded. Pressure chamber groups 9 are formed in the upper surface of the channel unit 4 opposite to the actuator units 21. A large number of pressure chambers 10 (see FIG. 5) are arrayed in a matrix in each pressure chamber group 9. In other words, each actuator unit 21 has dimensions ranging over the large number of pressure chambers 10 constituting the corresponding pressure chamber group 9.

Returning to FIG. 2, the base block 71 is made of a metal material such as stainless steel. Each ink reservoir 3 in the base block 71 is a substantially rectangular parallelepiped hollow region extending in the longitudinal direction of the base block 71. The ink reservoir 3 is supplied with ink from an ink tank (not shown) through an opening (not shown) provided at one end of the ink reservoir 3, so as to be always filled with the ink. The ink tank is installed externally. The ink reservoir 3 is provided with a total of ten openings 3b arranged in two lines in the extending direction of the ink reservoir 3. The openings 3b are provided to make the ink flow out. The openings 3b are disposed zigzag so as to be connected to the openings 3a of the channel unit 4. That is, the ten openings 3b of the ink reservoir 3 has the same positional relationship as the ten openings 3a of the channel unit 4 in plan view.

A lower surface 73 of the base block 71 projects downward in neighbor portions 73a of the openings 3b with respect to their circumferences. The base block 71 abuts against neighbor portions of the openings 3a in the upper surface of the channel unit 4 only in the projecting neighbor portions 73a of the openings 3b. Thus, any region other than the neighbor portions 73a of the openings 3b is separated from the head body 70, and the actuator units 21 are disposed in these separated regions.

A holder 72 includes a holding portion 72a for holding the base block 71, and a pair of projecting portions 72b. The projecting portions 72b are provided at a distance from each other in the sub-scanning direction. The projecting portions 72b project upward from the upper surface of the holding portion 72a. The base block 71 is fixedly bonded into a recess portion formed in the lower surface of the holding portion 72a of the holder 72. Each FPC 50 bonded to the corresponding actuator unit 21 is disposed to follow the surface of the corresponding projecting portion 72b of the holder 72 through an elastic member 83 of sponge or the like. Driver ICs 80 are disposed on the FPCs 50 disposed on the surfaces of the projecting portions 72b of the holder 72. That is, the FPCs 50 are electrically connected to a driver ICs 80 and the actuator units 21 of the head body 70 so that driving signals output from the driver ICs 80 can be transmitted to the actuator units 21.

A substantially rectangular parallelepiped heat sink 82 is disposed in close contact with the outside surface of each driver IC 80. As a result, heat generated in the driver ICs 80 is dissipated by the heat sinks 82. A board 81 connected to the outside of each FPC 50 is disposed above the corresponding driver IC 80 and the corresponding heat sink 82. Seal members 84 are put between the upper surface of the heat sink 82 and the board 81 and between the lower surface of the heat sink 82 and the FPC 50 respectively so as to prevent dust or ink from entering into the body of the inkjet head 1.

Figure 4:
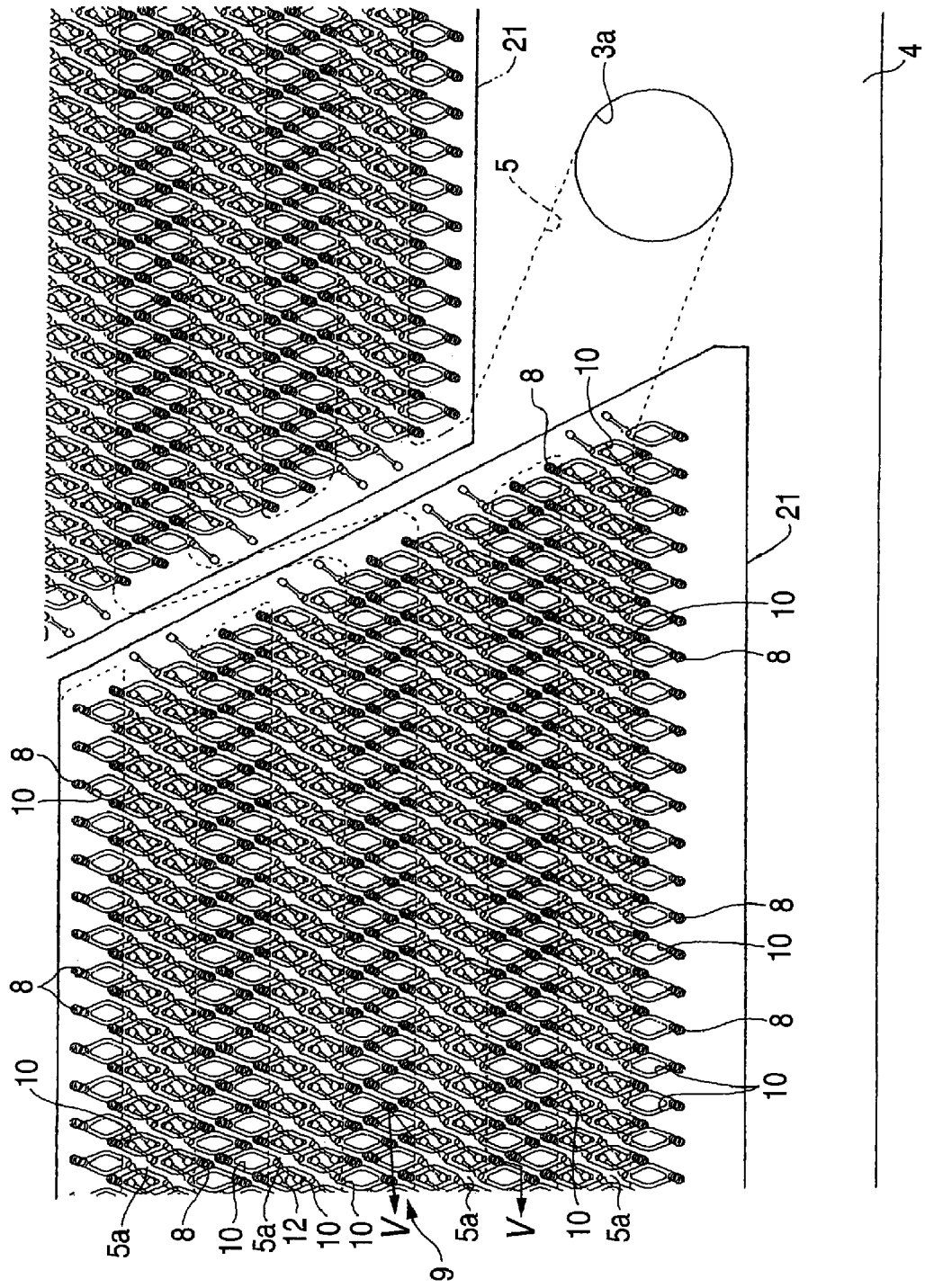
FIG. 4 is an enlarged plan view of a region surrounded by a chain line shown in FIG. 3.

FIG. 4 is an enlarged plan view of the region surrounded by a chain line shown in FIG. 3. As shown in FIG. 4, in the regions of the channel unit 4 opposite to the actuator units 21, four sub-manifold channels 5a extend in parallel to the longitudinal direction (main scanning direction) of the channel unit 4. A large number of individual ink channels 7 (see FIG. 5) communicating with the nozzles 8 respectively are connected to each sub-manifold channel 5a.

In the upper surface of the channel unit 4, a pressure chamber group 9 including the large number of pressure chambers 10 each having a nearly rhomboid planar shape is formed in a region opposite to each actuator unit 21. The pressure chamber group 9 has a trapezoidal shape substantially as large as the outer shape of the actuator unit 21. Such a pressure chamber group 9 is formed for each actuator unit 21. Each pressure chamber 10 belonging to the pressure chamber group 9 communicates with its corresponding nozzle 8 at one end of its long diagonal, and communicates with the sub-manifold channel 5a through an aperture 12 at the other end of the long diagonal. As will be described later, individual electrodes 35 (see FIGS. 6A and 6B) are arrayed in a matrix on the actuator unit 21 so as to be opposed to the pressure chambers 10, respectively. Each individual electrode 35 has a nearly rhomboid shape in plan view and is one size smaller than the pressure chamber 10. Incidentally, in FIG. 4, the pressure chambers 10, the apertures 12 and the nozzles 8, which should be depicted by broken lines because they are located under the actuator units 21, are depicted by solid lines in order to make the drawing understood easily.

Figure 5:
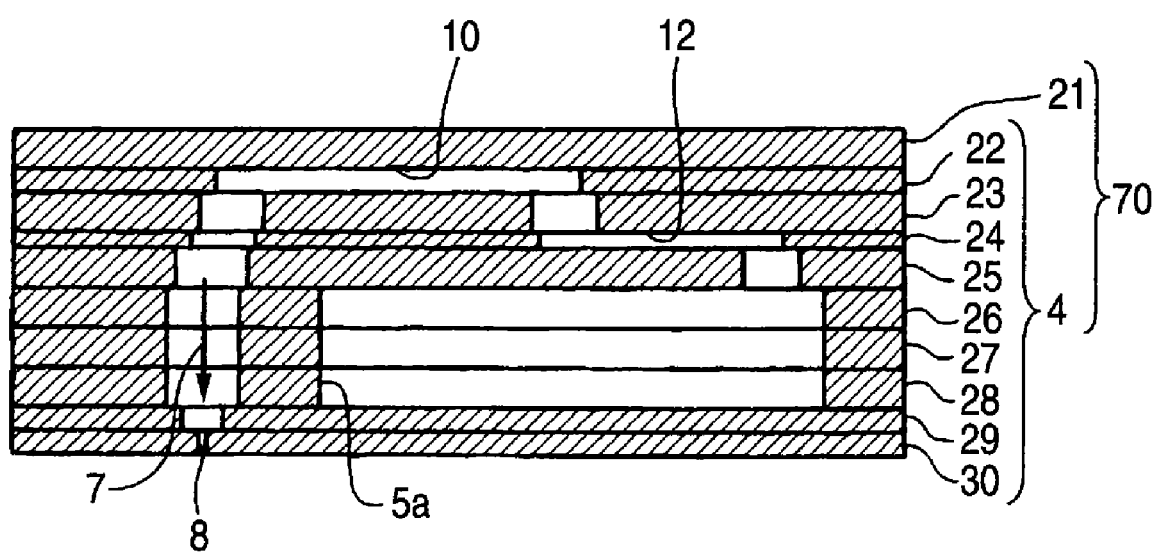
FIG. 5 is a sectional view taken along a line V-V in FIG. 4.

Next, description will be made on the sectional structure of the head body 70. FIG. 5 is a sectional view taken along a line V-V in FIG. 4, showing an individual ink channel. In this embodiment, each individual ink channel 7 once runs upward, and reaches one end portion of a corresponding pressure chamber 10 formed in the upper surface of the channel unit 4. Further, the individual ink channel 7 runs obliquely downward from the other end portion of the pressure chamber 10 extending horizontally. Thus, the individual ink channel 7 is connected to a corresponding nozzle 8 formed in the lower surface of the channel unit 4. As a whole, each individual ink channel 7 has an arched shape with a corresponding pressure chamber 10 disposed on its top. Thus, the individual ink channels 7 can be disposed with high density, so that ink can flow smoothly.

As is understood from FIG. 5, the head body 70 has a laminated structure constituted by the actuator units 21 on the upper side and the channel unit 4 on the lower side. Both the units 4 and 21 are constituted by laminating a plurality of thin sheets. Of these, in each actuator unit 21, four piezoelectric sheets 41-44 (see FIGS. 6A and 6B) are laminated, and electrodes are disposed, as will be described in detail later. Of the piezoelectric sheets 41-44, only the uppermost layer is a piezoelectric layer having portions serving as active portions when an electric field is applied thereto (hereinafter referred to as "layer having active portions"). The other three piezoelectric layers are inactive layers having no active portion.

On the other hand, the channel unit 4 is constituted by laminating a total of nine sheet materials serving as a cavity plate 22, a base plate 23, an aperture plate 24, a supply plate 25, manifold plates 26-28, a cover plate 29 and a nozzle plate 30.

The cavity plate 22 is a metal plate in which a large number of nearly rhomboid holes for forming spaces of the pressure chambers 10 are provided within the range where the actuator unit 21 is pasted. The base plate 23 is a metal plate in which for each pressure chamber 10 of the cavity plate 22, a communication hole between the pressure chamber 10 and the aperture 12 and a communication hole between the pressure chamber 10 and the nozzle 8 are provided.

The aperture plate 24 is a metal plate in which for each pressure chamber 10 of the cavity plate 22 a communication hole between the pressure chamber 10 and the corresponding nozzle 8 is provided in addition to a hole which will serve as the aperture 12. The supply plate 25 is a metal plate in which for each pressure chamber 10 of the cavity plate 22 a communication hole between the aperture 12 and the sub-manifold channel 5a and a communication hole between the pressure chamber 10 and the corresponding nozzle 8 are provided. Each of the manifold plates 26-28 is a metal plate in which for each pressure chamber 10 of the cavity plate 22 a communication hole between the pressure chamber 10 and the corresponding nozzle 8 is provided. The cover plate 29 is a metal plate in which for each pressure chamber 10 of the cavity plate 22 a communication hole 29a between the pressure chamber 10 and the corresponding nozzle 8 is provided. The nozzle plate 30 is a metal plate in which a nozzle 8 is provided for each pressure chamber 10 of the cavity plate 22.

These nine plates 22-30 are aligned and laminated to one another so that individual ink channels 7 are formed as shown in FIG. 5. The nine plates constituting the channel unit 4 are made of one and the same metal material in this embodiment. Although SUS430 is used, another metal material such as SUS316 or 42 alloy may be used. Alternatively, the plates 22-30 may be made of different metal materials.

As is apparent from FIG. 5, the pressure chambers 10 and the apertures 12 are provided on different levels in the laminated direction of the respective plates. Consequently, in the channel unit 4 opposite to the actuator units 21, as shown in FIG. 4, an aperture 12 communicating with one pressure chamber 10 can be disposed in the same position as another pressure chamber 10 adjacent to the one pressure chamber 10 in plan view. As a result, the pressure chambers 10 are brought into close contact with one another and arrayed with higher density. Thus, high-resolution image printing can be attained by the inkjet head 1 occupying a comparatively small area.

Figure 6A:
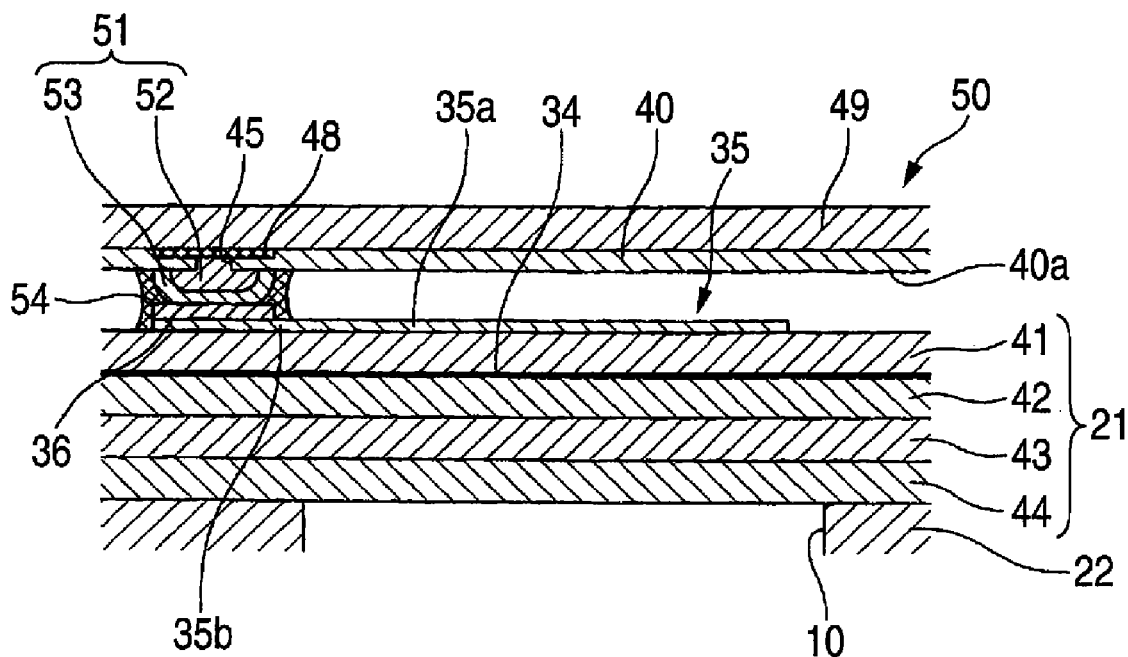
FIG. 6A is a partially enlarged sectional view showing a bonding structure between an actuator unit and an FPC.
Figure 6B:
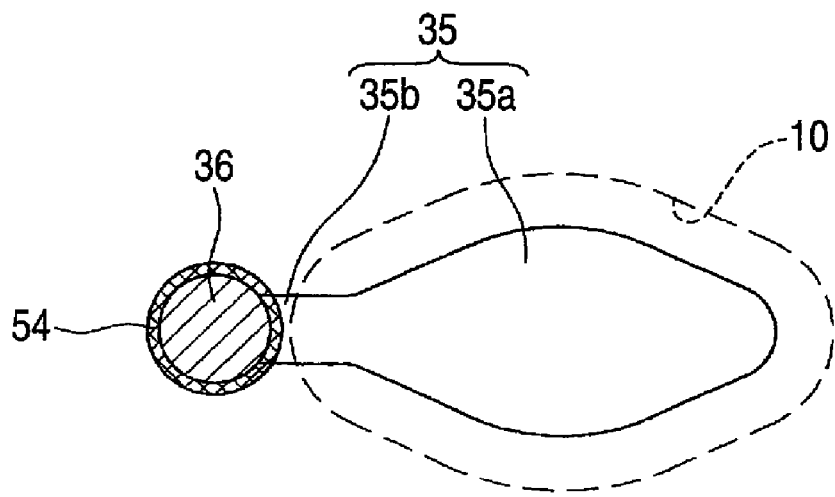
FIG. 6B is a partially enlarged plan view of the actuator unit.

Next, description will be made about the bonding structure between the actuator unit 21 and the FPC 50. FIG. 6A is a partially enlarged sectional view showing the bonding structure between the actuator unit 21 and the FPC 50. FIG. 6B is a partially enlarged plan view of the actuator unit 21.

As shown in FIG. 6A, the actuator unit 21 includes four piezoelectric sheets 41-44 each formed to have one and the same thickness of about 15 μm. The piezoelectric sheets 41-44 are formed as continuous lamellar flat plates (continuous flat plate layers) to be disposed over a large number of pressure chambers 10 constituting a pressure chamber group 9. When the piezoelectric sheets 41-44 are disposed as continuous flat plate layers over a large number of pressure chambers 10, the individual electrodes 35 can be disposed on the piezoelectric sheet 41 with high density, for example, by use of a screen printing technique. Accordingly, the pressure chambers 10 to be formed in positions corresponding to the individual electrodes 35 can be also disposed with high density. Thus, high-resolution images can be printed. The piezoelectric sheets 41-44 are made of a lead zirconate titanate (PZT) based ceramics material having ferroelectricity.

In this embodiment, the individual electrodes 35 are formed only on the piezoelectric sheet 41, which is the uppermost layer. A common electrode 34 formed all over the sheet surface (all over the back surface of the piezoelectric sheet 41) and having a thickness of about 2 μm is put between the piezoelectric sheet 41, which is the uppermost layer, and the piezoelectric sheet 42, which is under the piezoelectric sheet 41. No electrode is disposed between the piezoelectric sheet 42 and the piezoelectric sheet 43 or between the piezoelectric sheet 43 and the piezoelectric sheet 44. The individual electrodes 35 and the common electrode 34 are made of a metal material such as Ag—Pd based metal material.

As shown in FIG. 6B, each individual electrode 35 includes a main electrode region 35a and an accessory electrode region 35b. The main electrode region 35a is disposed in a position where the main electrode region 35a is opposed to the pressure chamber 10. The accessory electrode region 35b is connected to the main electrode region 35a and led out from an acute portion of the main electrode region 35a to a position where the accessory electrode region 35b does not face the pressure chamber 10. The main electrode region 35a has a nearly rhomboid planar shape, which is substantially similar to the pressure chamber 10, and whose salient portion is formed by a curved line. A substantially circular land 36 (functioning as a second terminal) is provided in a position where the land 36 is in contact with the tip of the accessory electrode region 35b. As shown in FIG. 6B, the land 36 is opposed to a region of the cavity plate 22 where no pressure chamber 10 is formed. The land 36 is, for example, made of gold containing glass frit. The land 36 is formed on the surface of an end portion of the accessory electrode portion 35b as shown in FIG. 6A. The common electrode 34 is grounded in a not-shown region. Consequently, the common electrode 34 is kept in constant potential or the ground potential in this embodiment equally over the regions corresponding to all the pressure chambers 10.

As shown in FIG. 6A, the FPC 50 includes a base film 49, a plurality of wires 48 made of copper foil and formed on the lower surface of the base film 49, and a cover film 40 covering substantially all the lower surface of the base film 49. In the cover film 40, a through hole 45 is formed in a position facing one end portion of each wire 48. The end portion of each wire 48 has a circular shape with an enlarged diameter. The through hole 45 is formed to have a smaller diameter than the diameter of one end portion of each wire 48. That is, the outer circumferential edge portion of the one end portion of each wire 48 is covered with the cover film 40 as shown in FIG. 6A. A terminal 51 (functioning as a first terminal) of the FPC 50 is bonded to the one end portion of the wire 48 through the through hole 45. The other end portion of the wire 48 is electrically connected to the driver IC 80.

The base film 49 and the cover film 40 are sheet members having insulating properties. In the FPC 50 in this embodiment, the base film 49 is made of polyimide resin, and the cover film 40 is made of a photosensitive material. Both of the base film 49 and the cover film 40 have flexibility. Since the cover film 40 is made of the photosensitive material, it is easy to form a large number of through holes 45.

The terminal 51 includes a core 52 (functioning as a metal core) having electric conductivity and a solder layer 53 having electric conductivity. For example, the core 52 includes or is made of nickel. The solder layer 53 is formed to cover the surface of the core 52. The terminal 51 is formed to close the through hole 45 while covering the outer circumferential edge of the through hole 45 in a lower surface 40a of the cover film 40, so as to be convex toward the piezoelectric sheet 41. A thermosetting adhesive 54 is disposed in the outer circumference of the terminal 51 as shown in FIG. 6A. A tip portion of the solder layer 53 of the terminal 51 and the land 36 abut against each other so as to be electrically connected with each other. Also, the thermosetting adhesive 54 surrounding the land 36 and the terminal 51 bonds the piezoelectric sheet 41 with the lower surface 40a of the cover film 40. The thermosetting adhesive 54 is an epoxy-based agent having insulating properties. Since the thermosetting adhesive 54 surrounds the terminal 51 and the land 36 so as to bond them with each other, the solder layer 53 melted by heating can be restrained from flowing out to the periphery. In parallel therewith, the individual electrodes 35 can be prevented from short-circuiting.

An Sn-3Ag-0.5Cu (tin-silver-copper) alloy is used for the solder layer 53 in this embodiment. This alloy is a Pb free solder in which Cu (copper) is added to an Sn—Ag based (high-melting) solder and whose melting point is 218° C. For example, the solder layer 53 may be formed out of an Sn—Ag based solder added with another metal such as Bi (bismuth). Further, not only three-element based alloys but also four-element based alloys may be used. An Sn—Cu based solder or an Sn—Sb (antimony) based solder other than the Sn—Ag based solder may be used as the high melting solder. The solder layer 53 may be formed out of not a high-melting solder but a middle-melting solder or a low-melting solder. An Sn—Zn (zinc) based solder may be used as the middle-melting solder. An Sn—Bi based solder or an Sn—In (indium) based solder may be used as the low-melting solder. These middle-melting solder and the low-melting solder may be three-element based or four-element based solders added with other metals. When the core 52 is made of nickel, the adhesion between the core 52 and the solder layer 53 made of such a material can be improved.

The FPC 50 has a large number of terminals 51. The terminals 51 are designed to correspond to the lands 36 one by one. Accordingly, the individual electrodes 35 electrically connected to the lands 36 respectively are connected to the driver ICs 80 through the wires 48 independent of one another in the FPC 50, respectively. Thus, the potential of each individual electrode 35 can be controlled individually for its corresponding pressure chamber 10.

Figure 7:
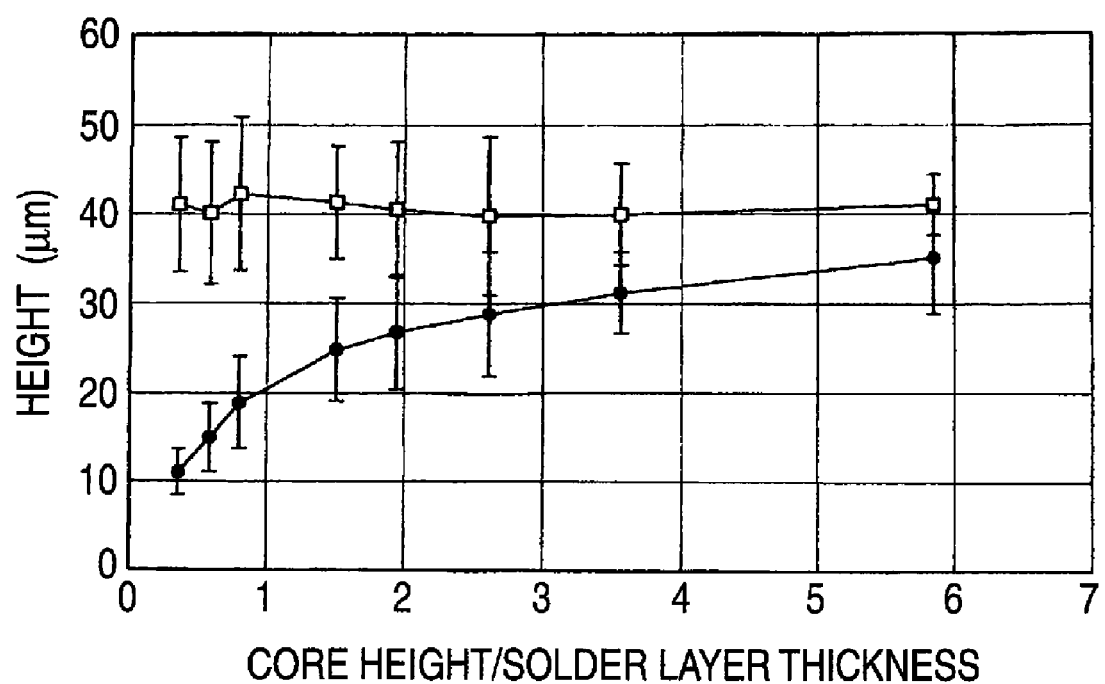
FIG. 7 is a graph showing variation ranges of a core height and a terminal height with respect to a ratio of the core height to a solder layer thickness.

Here, description will be made below on a relationship between a ratio of a height of the core 52 from the lower surface 40a to a thickness of the solder layer 53 and variations of a core height and a terminal height, which are generated when the core 52 and the solder layer 53 are formed. FIG. 7 is a graph showing the variation range of the height of the core 52 and the variation range of the height of the terminal 51 (variation range of a sum of the height of the core 52 and the thickness of the solder layer 53) with respect to each ratio of the height of the core 52 to the thickness of the solder layer 53 when the projecting height of the terminal 51 from the lower surface 40a is about 40 μm. The ordinate in FIG. 7 designates the height, and the abscissa designates the ratio of the core height to the solder layer thickness. The variation range of the core height and the variation range of the terminal height are expressed by values obtained by measuring 20 cores and 20 terminals produced for each ratio of the core height to the solder layer thickness.

Figure 15A:
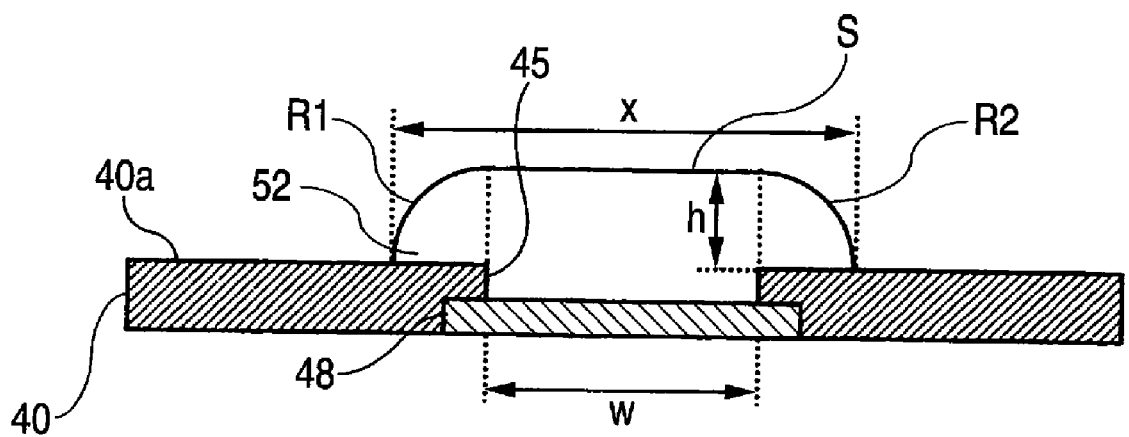
FIG. 15A is a view showing a state where a core is formed on the FPC (in a through hole and on a lower surface of a cover film)

Here, a method for measuring the height of the core 52 from the lower surface 40a of the cover film 40 (a surface of the FPC 50), the thickness of the solder layer 53 in the thickness direction of the FPC 50 and the height of the terminal 51 in the thickness direction of the FPC 50 will be described. As detailed later, the core 52 is formed in the through hole 45 and on the lower face 40a of the cover film 40 by the electroplating method (see FIG. 15A), and then, the solder layer 53 is formed on the core 52 by the electroplating method (see FIG. 15B). As shown in FIG. 15A, a contour of the grown core 52 has three portions, that is, a straight portion S and curve portions R1, R2 on both sides of the straight portion S. The straight portion S connects the curve portions R1, R2. The electroplating method grows the core 52 (e.g., nickel) isotropically. Therefore, the inventors assumed that:

(i) the curve portions R1, R2 are circular arcs having the same curvature radius r,
(ii) the straight portion S is in parallel to the lower surface 40a of the cover film 40, and
(iii) a width of the straight portion S is equal to a width w of the through hole 45.

As apparent from FIG. 15A, the height h of the core 52 is equal to the curvature radius r of the curve portions R1, R2. Since the through hole 45 is formed by the photolithography method (as described later), a width w of the through hole 45 is known in advance. After the core 52 is formed in the through hole 45 and on the lower surface 40a of the cover film 40, the width x of the core 52 from one end on the curve-portion R1 side to the other end on the curve-portion R2 side is measured using an optical microscope NEXIV VM-500N produced by Nikon Corporation. Specifically, the core 52 is observed two-dimensionally from above using the optical microscope to measure the width x of the core 52. Alternatively, this measurement may be done using a scanning electron microscope. Then, the height h of the core 52 can be obtained by the expression (1).

$$h = \frac{x - w}{2} \quad (1)$$

Alternatively, a contact-type step meter may be used to measure the height h of the core 52.

Thereafter, the solder layer 53 is formed on the core 52 height of which has already been known, by the electroplating method. A contour of the solder layer 53 (i.e., a contour of the terminal 51) also has three portions, that is, a straight portion S' and curve portions R1', R2' on both sides of the straight portion S'. The straight portion S' connects the curve portions R1', R2'. The electroplating method also grows the solder layer 53 (e.g., SnAgCu alloy) isotropically. Therefore, the inventors assumed that:

(iv) the curve portions R1', R2' are circular arcs having the same curvature radius r',
(v) the straight portion S' is in parallel to the lower surface 40a of the cover film 40 and the straight portion S of the core 52, and
(vi) a width of the straight portion S' is equal to the width w of the through hole 45.

Figure 15B:
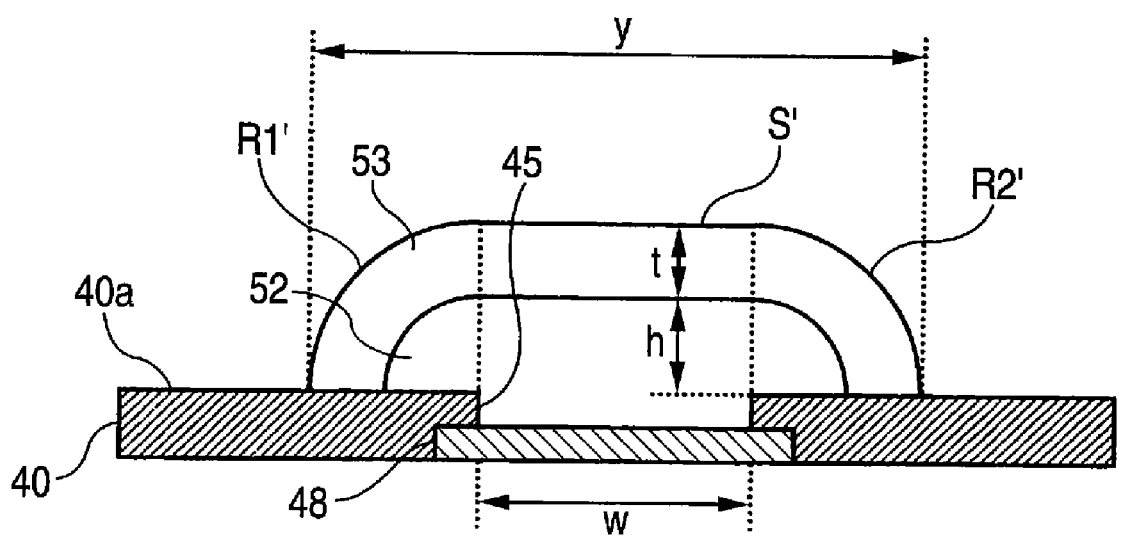
FIG. 15B is a view showing a state where a solder layer is formed on the core.

As apparent from FIG. 15B, the height (t+h) of the terminal 51 from the lower surface 40a of the cover film 40 is equal to the curvature radius r' of the curve portions R1', R2'. After the solder layer 53 is formed on the core 52, a width y of the terminal 51 from one end on the curve-portion R1' side to the other end on the curve-portion R2' side is measured using the optical microscope NEXIV VM-500N. Specifically, the terminal 51 (solder layer 53) is observed two-dimensionally from above using the optical microscope to measure the width y of the terminal 51. Alternatively, this measurement may be done using the scanning electron microscope. Then, the height (t+h) of the terminal 51 is obtained by the expression (2).

$$t + h = \frac{y - w}{2} \quad (2)$$

Alternatively, the contact-type step meter may be used to measure the height (t+h) of the terminal 51.

Finally, since the height h of the core 52 and the height (t+h) of the terminal 51 have already been known, the thickness t of the solder layer 53 in the thickness direction of the FPC 50 can be obtained by the expression (3).

$$t = \frac{y - w}{2} - h \quad (3)$$

Returning to FIG. 7, the lower limit value (the lower limit value of the variation) of the height of the terminal 51 and the upper limit value (the upper limit value of the variation) of the height of the core 52 begin to overlap each other at the point where the ratio of the core height to the solder layer thickness is 1.95:1, that is, the ratio is about 2:1. When the ratio is higher than 2:1, there is a tendency for the variation range of the height of the terminal 51 and the variation range of the height of the core 52 to overlap each other largely. On the contrary, when the ratio is equal to or less than 2:1, the variation range of the height of the terminal 51 and the variation range of the height of the core 52 hardly overlap each other.

Figure 16A:
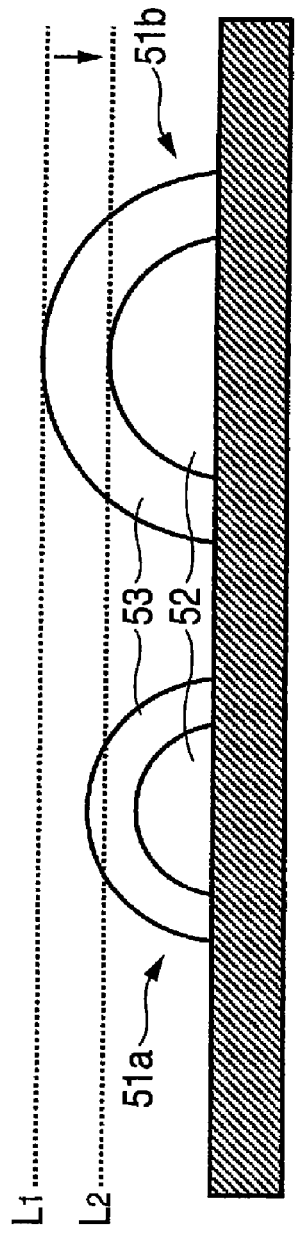
FIGS. 16A and 16B are schematic views of terminals 51 (51a to 51d).

The relation between the height of the terminal 51 and the height of the core 52 will be described with reference to FIG. 16. FIGS. 16A and 16B are schematic views of terminals 51. For the convenience of the description, the thermosetting adhesive 54 is omitted in FIGS. 16A and 16B. In FIG. 16A, a terminal 51a has the minimum height $(t+h)_{min}$ among terminals 51 formed on the same substrate (e.g., the FPC 50), and a core 52 of a terminal 51b has the maximum height $h_{max}$ among the cores 52 of the terminals 51 formed on the same substrate. The terminals 51a and 51b satisfy a relation that:

$$h_{max} \leq (t+h)_{min} \quad (4)$$

In other words, FIG. 16A shows the state where the variation range of the height of the terminal 51 and the variation range of the height of the core 52 does not overlap each other.

When the actuator unit 21 (the lands 36; not shown in FIG. 16A) and the FPC 50 (the terminals 51) are bonded to each other, the terminals 51a and 51b are pressed toward and against the actuator unit 21. Specifically, at first, the top of the solder layer 53 of the terminal 51b abuts against a corresponding land 36 of the actuator unit 21 and the solder layer 53 of the terminal 51b begins to deform due to reactive force from the land 36 of the actuator unit 21 while the terminal 51a is in contact with no land 36. Since the solder layer 53 is relatively soft, the reactive force deforms the solder layer 53b of the terminal 51b. The core 52 of the terminal 51b approaches the actuator unit 21 while the solder layer 53 of the terminal 51b is deforming. When the solder layer 53 of the terminal 51a abuts against the actuator unit 21, the solder layer 53 of the terminal 51a also begins to deform due to the reaction force from the actuator unit 21. Finally, the actuator unit 21 is located at a certain level $L_2$. In other words, as a result of the bonding processing of the actuator unit 21 and the FPC 50, the highest level ($L_1$) of the terminals is come down to the certain level $L_2$. FIG. 16A shows the case where the level $L_2$ is identical with the top of the core 52 of the terminal 51b. Since a broken line indicating the level $L_2$ intersects both the terminals 51a and 51b, the actuator unit 21 can electrically contact with both the terminals 51a and 51b surely. That is, when the variation range of the height of the terminal 51 and the variation range of the height of the core 52 does not overlap each other, the lands 36 of the actuator unit 21 can electrically contact with the terminals 51 of the FPC 50 reliably.

Returning to FIG. 7, it is therefore understood that it is preferable that the upper limit of the ratio of the height of the core 52 to the thickness of the solder layer 53 is equal to or lower than 2:1. The ratio may be equal to or less than 1.8:1. When the ratio is 2:1, the variation ranges of the both overlap each other just slightly as described above. Therefore, if the terminals 51 are formed on a substrate, which is too hard to bend, the terminals 51 and the lands 36 may be prevented from being electrically bonded with each other. However, since the terminals 51 are formed on the FPC 50 having flexibility in this embodiment, the FPC 50 bends lightly so that the terminals 51 approach the lands 36 when the terminals 51 and the lands 36 are bonded with each other. Thus, even if the ratio is 2:1, the terminals 51 and the lands 36 can be electrically bonded with each other surely also due to the effect of absorbing the variation of the solder layer 53 as will be described later.

Figure 16B:
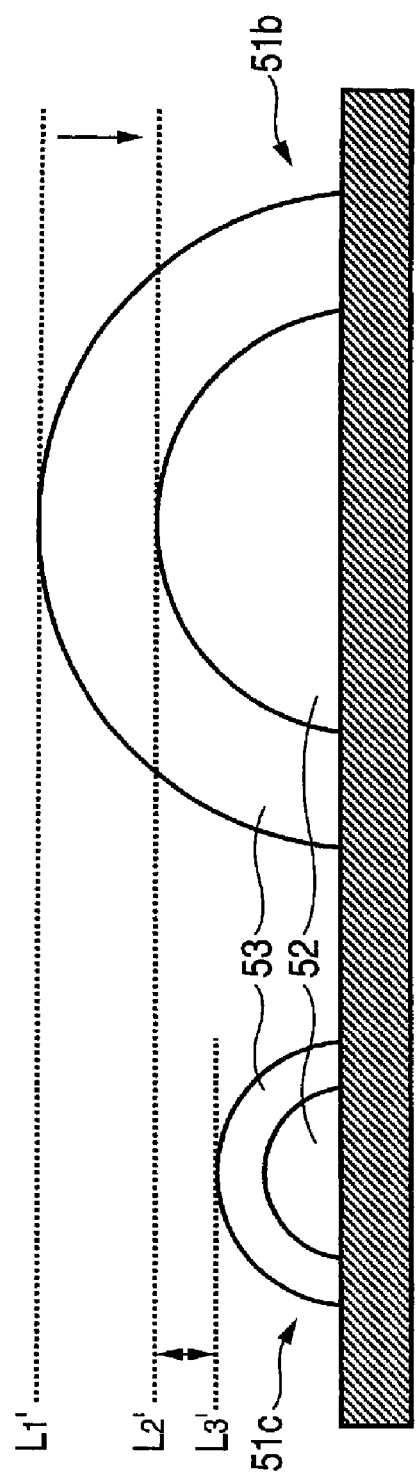

On the other hand, in FIG. 16B, a terminal 51c has the minimum height $(t+h)_{min}$ among terminals 51 formed on the same substrate (e.g., the FPC 50), and a core 52 of a terminal 51d has the maximum height $h_{max}$ among the cores 52 of the terminals 51 formed on the same substrate. The terminals 51c and 51d satisfy a relation that:

$$h_{max} > (t+h)_{min} \qquad (5)$$

In other words, FIG. 16B shows the state where the variation range of the height of the terminal 51 and the variation range of the height of the core 52 overlaps each other.

In this case, even if the substrate (the terminals 51c, 51d) is pressed until the core 52 of the terminal 51d abuts against the actuator unit 21, the actuator unit 21 (the land 36) does not contact with the terminal 51c located at the level $L_3'$, which is sufficiently separate from the level $L_2'$. It is noted that since the cores 52 of the terminals 51 are relative hard, the cores 52 of the terminals 51 don't deform only by pressing the terminals 51 against the actuator unit 21. Accordingly, when the variation range of the height of the terminal 51 and the variation range of the height of the core 52 overlap each other, the lands 36 of the actuator unit 21 may not electrically contact with the terminals 51 of the FPC 50.

Returning to FIG. 7, when the ratio is much higher than 2:1, the variation ranges of the both overlap each other largely as described above. Even if the FPC 50 bends slightly, the overlapping of the variation ranges cannot be absorbed by the effect of absorbing the variation of the solder layer 53 and the bending of the FPC 50. Thus, some terminals 51 and some lands 36 may be not bonded in contact with each other, or may be bonded insufficiently.

When the ratio is equal to or lower than 1.8:1, the variation ranges of the both do not overlap each other. Accordingly, the terminals 51 and the lands 36 can be bonded in contact with each other surely also due to the effect of absorbing the variation of the solder layer 53 even if the bending effect of the FPC 50 cannot be expected so much.

Figure 8:
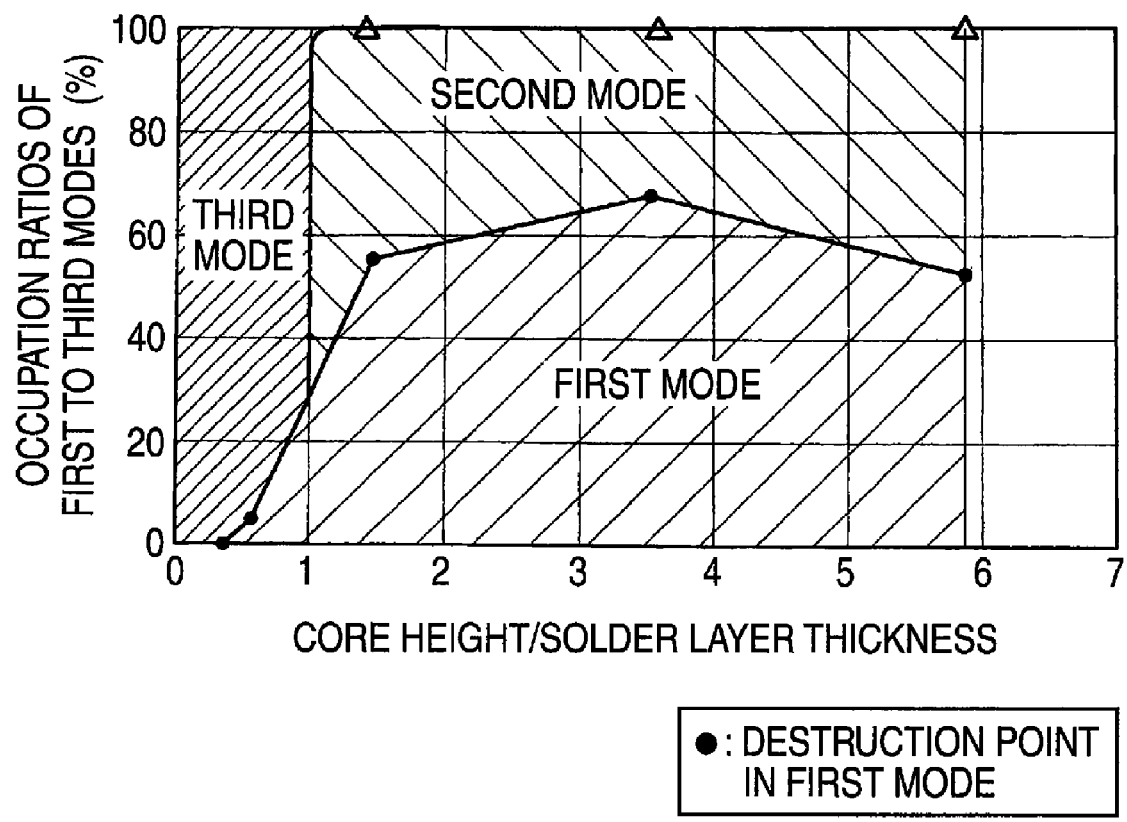
FIG. 8 is a graph showing a terminal destruction state after peeling test for each predetermined ratio.

FIG. 8 shows a graph showing the terminal destruction state after a peeling test for each predetermined ratio. In FIG. 8, the ordinate designates the rates occupied by first to third modes, and the abscissa designates the ratio of the core height to the solder layer thickness.

The peeling test herein is a destructive test as follows. That is, after the terminal 51 and the land 36 are bonded with each other, a sharp knife is used to scratch the periphery of the boundary between the terminal 51 and the FPC 50 to peel the FPC 50 from the actuator unit 21. The terminal condition of the FPC 50 is observed visually, and it is determined which mode the terminal condition has fallen into, a first mode, a second mode or a third mode. The first mode designates the case where one end portion of the wire 48 bonded with the terminal 51 is peeled from the FPC 50 when the terminal 51 bonded with the land 36 is peeled off. The second mode designates the case where the terminal 51 is peeled near the boundary between the terminal 51 and the wire 48 when the terminal 51 bonded with the land 36 is peeled off. The third mode designates the case where the terminal 51 is peeled near the boundary between the core 52 and the solder layer 53 when the terminal 51 bonded with the land 36 is peeled off.

Description will be made on the quality in each mode. When the peeling condition falls into the first mode, it is judged that bonding between the core 52 and the solder layer 53, that between the terminal 51 and the land 36 and that between the terminal 51 and the wire 48 are firm. Thus, the terminal formation state is good. When the peeling condition falls into the second mode, it is judged that bonding strength between the terminal 51 and the wire 48 is smaller than that sin the first mode, but that bonding between the core 52 and the solder layer 53 and that between the terminal 51 and the land 36 are firm. Thus, the terminal formation state is practicable and good. However, when the peeling condition falls into the third mode, it is judged that adhesion force between the core 52 and the solder layer 53 is small due to the small surface area of the core 52 bonded with the solder layer 53. Thus, the terminal formation state is bad.

FIG. 8 shows the shares of the first to third modes (hatched areas shown in FIG. 8) obtained as follows. For each predetermined ratio of the height of the core 52 to the thickness of the solder layer 53, the peeling test was performed. It was then determined which mode the states of a plurality of terminals belong to, the first mode, the second mode or the third mode. After that, the number of terminals regarded as destroyed in the first mode is divided by the total number of terminals. Values obtained thus for the ratios are plotted by black points. The number of terminals regarded as destroyed in the first and second modes is divided by the total number of terminals. Values obtained thus for the ratios are plotted by triangular points. The black points are connected to one another by a line, and the triangular points are connected to one another by a line, so as to show the shares of the first to third modes (the hatched regions shown in FIG. 8).

As shown in FIG. 8, when the ratio of the core height to the solder layer thickness is 5.85:1, destruction in the first mode occupies 53% when the terminals 51 bonded to the lands 36 are peeled. Destruction in the second mode occupies the rest 47%. When the ratio of the core height to the solder layer thickness is 3.56:1, destruction in the first mode occupies 68%, and destruction in the second mode occupies the rest 32%. When the ratio of the core height to the solder layer thickness is 1.5:1, destruction in the first mode occupies 55%, and destruction in the second mode occupies the rest 45%. When the ratio of the core height to the solder layer thickness is 0.59:1, destruction in the first mode occupies 5%, and destruction in the third mode occupies the rest 95%. When the ratio of the core height to the solder layer thickness is 0.36:1, destruction in the third mode occupies 100%. Thus, destruction in the first mode decreases suddenly as the ratio goes from 1.5:1 to 1:1. In the point where the lines connecting the black points and the triangular points cross each other, that is, when the ratio of the core height to the solder layer thickness is 1:1, destruction in the first mode becomes 30%, and destruction in the second mode becomes 70%. As shown in FIG. 8, when the ratio is lower than 1:1, all destruction except that in the first mode occurs in the third mode. On the contrary, when the ratio is not lower than 1:1, all destruction except that in the first mode occurs in the second mode.

It is therefore understood from FIG. 8 that the lower limit value of the ratio of the core height to the solder layer thickness is 1:1. When the ratio of the core height to the solder layer thickness is equal to or larger than 1:1, destruction occurs only in the first mode and the second mode. Accordingly, each terminal 51 reaches a practicable level. On the contrary, when the ratio is lower than 1:1, destruction in the first mode decreases while destruction in the third mode increases. Thus, some terminals 51 do not reach the practicable level. Therefore, when the lower limit value of the ratio of the core height to the solder layer thickness is set at 1:1, the state where the terminals 51 are formed is improved. That is, when the ratio of the height of the core 52 to the thickness of the solder layer 53 in each terminal 51 is equal to or larger than 1:1, the surface area of the core 52 closely adhering to the solder layer 53 can be kept large enough to keep the adhesion between the core 52 and the solder layer 53 higher than the bonding strength between the core 52 and the wire 48. If this ratio were lower than 1:1, the surface area of the core 52 could not be kept large enough to keep the adhesion the core 52 and the solder layer 53 higher than the bonding strength between the core 52 and the wire 48. That is, destruction would occur in the third mode.

In the plurality of terminals 51 of this embodiment, the core 52 is averagely about 24.8 µm high from the lower surface 40a, and the solder layer 53 is averagely 16.5 µm thick. That is, the ratio of the height of the core 52 to the thickness of the solder layer 53 in each terminal 51 is about 1.5:1. When the ratio between the core 52 and the solder layer 53 constituting the terminal 51 is 1.5:1, the ratio is put within a range between the upper limit value 1.8:1 and the lower limit value 1:1, and destruction in the first mode reaches 50% or higher. Accordingly, when the terminals 51 are formed, there is no fear that the variation ranges of the cores 52 and the solder layers 53 overlap each other. Further, the terminals 51 have good bonding conditions between the terminals 51 and the lands 36.

Thus, the reliability of the terminals 51 is improved. In addition, it will go well if the ratio of the core height to the solder layer thickness is in a range of from 1:1 to 2:1. Accordingly, when the terminal height is set at about 40 µm, the thickness of the solder layers 53 may be set in a range of from about 13.3 µm to about 20 µm. When the thickness of the solder layers 53 is set within this range, it is possible to improve the effect of absorbing variations caused by the softening of the solder layers 53 when the terminals 51 and the lands 36 are bonded with each other. That is, the solder layers 53 become thicker than in the aforementioned publication, so that the range where the variation of the terminal height can be absorbed can be expanded.

Next, description will be made on a method for driving each actuator unit 21. The piezoelectric sheet 41 in the actuator unit 21 has a polarizing direction in the thickness direction of the piezoelectric sheet 41, which is the same as the direction to apply an electric field. That is, the actuator unit 21 has a so-called unimorph type configuration in which one piezoelectric sheet 41 on the upper side (that is, distant from the pressure chambers 10) is set as a layer where active portions exist, while three piezoelectric sheets 42-44 on the lower side (that is, close to the pressure chambers 10) are set as inactive layers. Accordingly, when the individual electrodes 35 are set at positive or negative predetermined potential, each electric-field-applied portion between electrodes in the piezoelectric sheet 41 will act as an active portion (pressure generating portion) so as to contract in a direction perpendicular to the polarizing direction due to piezoelectric transversal effect.

On the other hand, since the piezoelectric sheets 42-44 are not affected by any electric field, they are not displaced voluntarily. Therefore, between the upper piezoelectric sheet 41 and each lower piezoelectric sheet 42-44, there occurs a difference in strain in a direction perpendicular to the polarizing direction, so that the piezoelectric sheets 41-44 as a whole try to be deformed to be convex on the inactive side (unimorph deformation). In this event, as shown in FIG. 6A, the lower surface of the actuator unit 21 constituted by the piezoelectric sheets 41-44 is fixed to the upper surface of a diaphragm (cavity plate 22) which defines the pressure chambers. Consequently, the piezoelectric sheets 41-44 are deformed to be convex on the pressure chamber side. Accordingly, the volume of each pressure chamber 10 is reduced so that the pressure of ink increases. Thus, the ink is discharged from the corresponding nozzle 8. After that, when the individual electrodes 35 are restored to the same potential as the common electrode 34, the piezoelectric sheets 41-44 are restored to their initial shapes so that the volume of each pressure chamber 10 is restored to its initial volume. Thus, the pressure chamber 10 sucks ink from the sub-manifold channel 5.

According to another driving method, each individual electrode 35 may be set at potential different from the potential of the common electrode 34 in advance. In this method, the individual electrode 35 is once set at the same potential as the common electrode 34 whenever there is a discharge request. After that, the individual electrode 35 is set at potential different from the potential of the common electrode 34 again at predetermined timing. In this case, the piezoelectric sheets 41-44 are restored to their initial shapes at the timing when the individual electrode 35 has the same potential as that of the common electrode 34. Thus, the volume of the pressure chamber 10 increases in comparison with its initial volume (in the state where the individual electrode 35 and the common electrode 34 are different in potential), so that ink is sucked into the pressure chamber 10 through the sub-manifold channel 5. After that, the piezoelectric sheets 41-44 are deformed to be convex on the pressure chamber 10 side at the timing when the individual electrode 35 is set at different potential from that of the common electrode 34 again. Due to reduction in volume of the pressure chamber 10, the pressure on ink increases so that the ink is discharged. In such a manner, ink is discharged from the nozzles 8 while the inkjet head 1 is moved suitably in the main scanning direction. Thus, a desired image is printed on paper.

Figure 9:
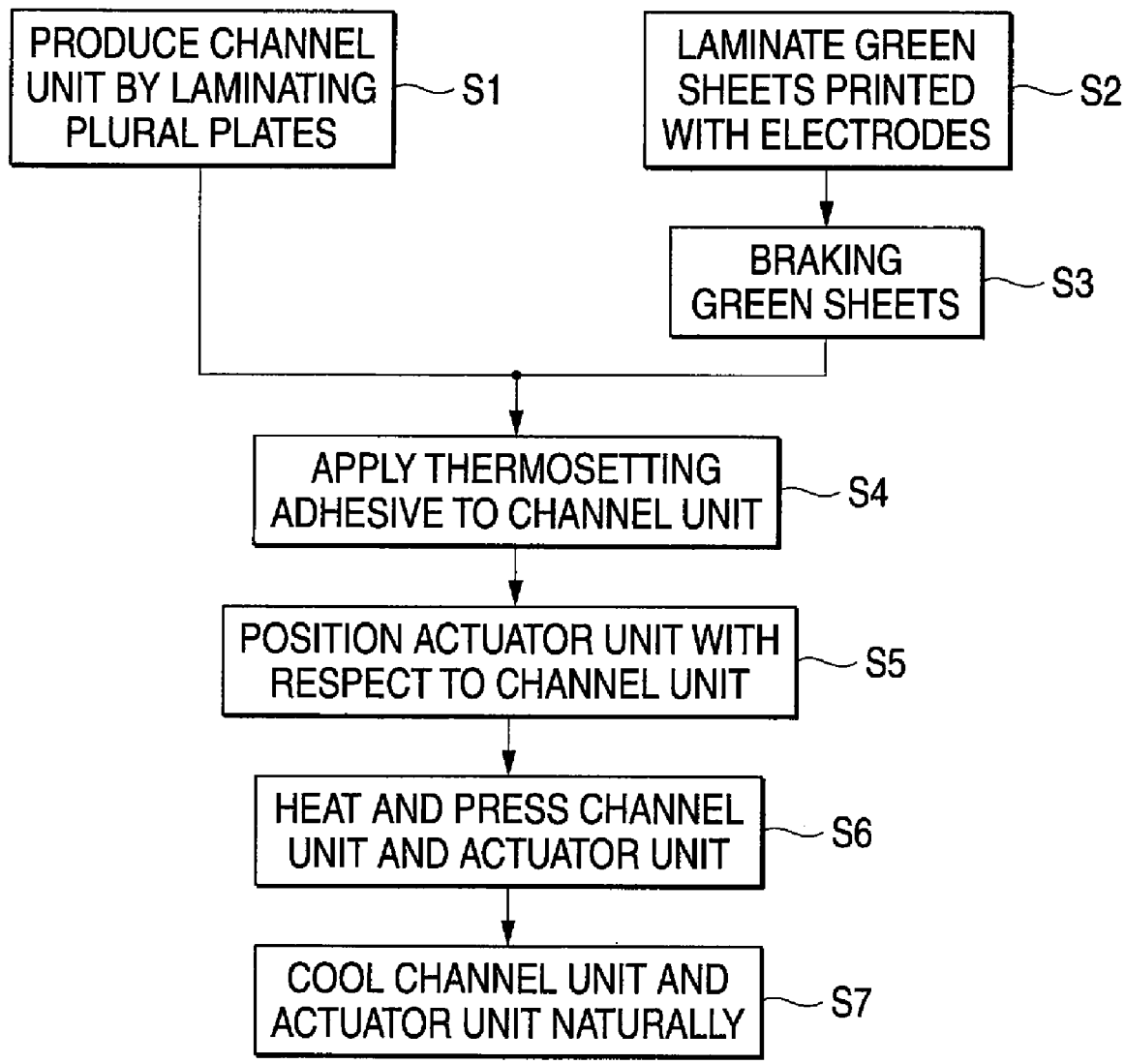
FIG. 9 is a flow chart of a manufacturing process of the inkjet head.
Figure 10:
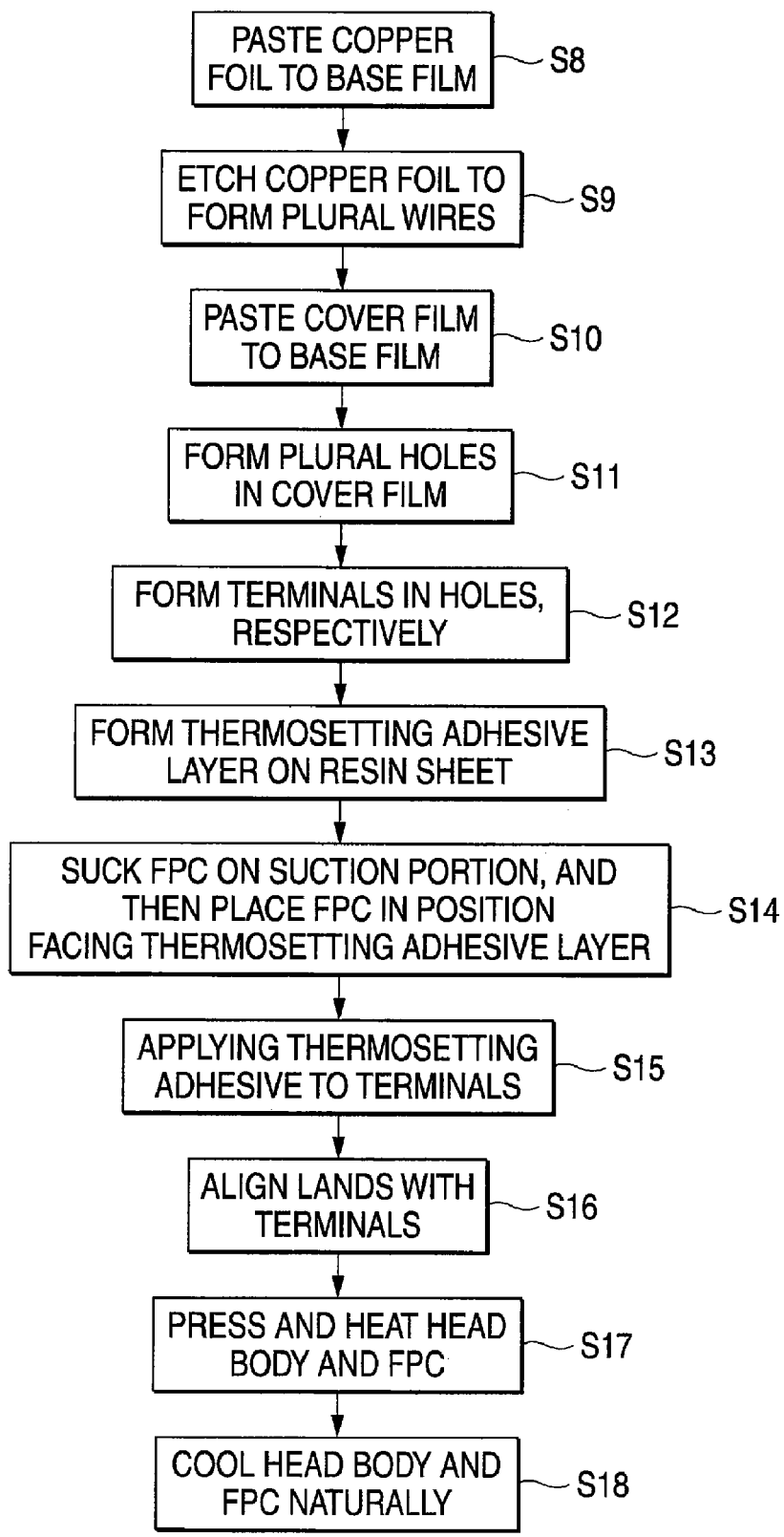
FIG. 10 is a flow chart of the manufacturing process of the inkjet head.

Next, a method for manufacturing the aforementioned inkjet head 1 will be described below. FIGS. 9 and 10 are flow charts of a manufacturing process of the inkjet head 1. To manufacture the inkjet head 1, parts such as the channel unit 4 and the actuator units 21 are produced individually, and the respective parts are assembled. As shown in FIG. 9, first, the channel unit 4 is produced in Step 1 (S1). To produce the channel unit 4, etching is performed upon the respective plates 22-30 constituting the channel unit 4, with patterned photo-resist as mask. Thus, holes as shown in FIG. 5 are formed in the respective plates 22-30. After that, the nine plates 22-30 aligned to form the individual ink channels 7 are laminated on one another through a thermosetting adhesive. The nine plates 22-30 are heated to a temperature equal to or higher than the curing temperature of the thermosetting adhesive while pressure is applied thereto. As a result, the thermosetting adhesive is cured so that the nine plates 22-30 are fixedly bonded with one another. Thus, the channel unit 4 as shown in FIG. 5 can be obtained.

On the other hand, to produce each actuator unit 21, first, a plurality of green sheets of piezoelectric ceramics are prepared in Step 2 (S2). The green sheets are formed in advance in expectation of shrinkage caused by baking. Conductive paste is screen-printed on a part of the green sheets in accordance with the pattern of the common electrode 34. The green sheets are aligned with one another by use of a jig, so that the green sheet in which the conductive paste has been printed in accordance with the pattern of the common electrode 34 is laid under one of the green sheets in which the conductive paste has not been printed, and the other two of the green sheets in which the conductive paste has not been printed are laid further thereunder.

In Step 3 (S3), the laminate obtained in Step 2 is degreased in the same manner as known ceramics, and further baked at a predetermined temperature. Consequently, the four green sheets are formed as the piezoelectric sheets 41-44, and the conductive paste is formed as the common electrode 34. After that, conductive paste is screen-printed on the uppermost piezoelectric sheet 41 in accordance with the pattern of the individual electrodes 35. The laminate is heated to bake the conductive paste. Thus, the individual electrodes 35 are formed on the piezoelectric sheet 41. After that, gold containing glass frit is printed on the tip portions of the accessory electrode regions 35b of the individual electrodes 35 so as to form the lands 36 (forming of a second terminal). In such a manner, the actuator units 21 as shown in FIG. 6A can be produced.

The channel unit production step of Step 1 and the actuator unit production step of Steps 2-3 are performed independently. Any one of the steps may be performed previously, or the both may be performed in parallel.

Next, in Step 4 (S4), by use of a bar coater, a thermosetting adhesive whose thermocuring temperature is about 80° C. is applied onto the upper surface of the channel unit 4 obtained in Step 1, where a large number of openings of the pressure chambers 10 have been formed. For example, a two-component mixing type agent is used as the thermosetting adhesive.

Subsequently in Step 5 (S5), the actuator units 21 are mounted on the thermosetting adhesive applied to the channel unit 4. In this event, each actuator unit 21 is supported on beam portions among the pressure chambers 10 and positioned with respect to the channel unit 4 so that the individual electrodes 35 and the pressure chambers 10 are opposed to each other. This positioning is performed based on positioning marks (not shown) formed in the channel unit 4 and the actuator units 21 in the production steps (Step 1 to Step 3) in advance.

Next, in Step 6 (S6), the laminate of the channel unit 4, the thermosetting adhesive between the channel unit 4 and the actuator units 21, and the actuator units 21 is pressurized and heated to a temperature equal to or higher than the curing temperature of the thermosetting adhesive by a not-shown heating/pressurizing apparatus. Consequently, the openings of the pressure chambers 10 are closed by the actuator units 21. In Step 7 (S7), the laminate taken out from the heating/pressurizing apparatus is cooled naturally. Thus, the head body 70 constituted by the channel unit 4 and the actuator units 21 are manufactured.

Subsequently, to produce the FPC 50, first in Step 8 (S8), the base film 49 made of polyimide resin is prepared, and copper foil is pasted all over one surface of the base film 49 through an adhesive, as shown in FIG. 10. In Step 9 (S9), photo-resist is patterned and formed on the surface of the copper foil. Etching is performed upon the copper foil with the photo-resist as mask. Thus, the copper foil other than portions serving as the plurality of wires 48 is removed. After that, the photo-resist is removed. Next, in Step 10 (S10), the photosensitive cover film 40 is pasted through an adhesive to the surface of the base film 49 where the wires 48 have been formed. In Step 11 (S11), the through holes 45 are formed in positions of the cover film 40 opposed to the lands 36 and opposed to one-end portions of the wires 48, respectively. In this event, a mask having a pattern corresponding to the through holes 45 is used for forming the through holes 45 by the photolithography method similar to that for forming the wires 48. Next, in Step 12 (S12), the cores 52 made of nickel are formed in the one-end portions of the wires 48 exposed from the through holes 45 by the electroplating method so that the cores 52 project over the lower surface 40a of the cover film 40. The solder layers 53 made of SnAgCu alloy are formed on the surfaces of the cores 52 by the electroplating method. Thus, the terminals 51 electrically connected to the wires 48 respectively are formed (forming a first terminal). In this event, the terminals 51 are formed so that the ratio between the core 52 and the solder layer 53 forming each terminal 51 is in a range of from 1:1 to 2:1, preferably in a range of from 1:1 to 1.8:1 as described above. In this embodiment, each terminal 51 is formed by the electroplating method so that the tip of the core 52 is about 25 μm high from the lower surface 40a, and the solder layer 53 is about 15 μm thick. Due to variations occurring in the height and the thickness, the core 52 is averagely about 24.8 μm high, and the solder layer 53 is averagely about 16.5 μm thick as described above. The ratio of the core height to the solder layer thickness in each terminal 51 in the FPC 50 is in a range of from 1:1 to 2:1 and also is in a range of from 1:1 to 1.8:1. Thus, the FPC 50 is manufactured.

Figure 11A:
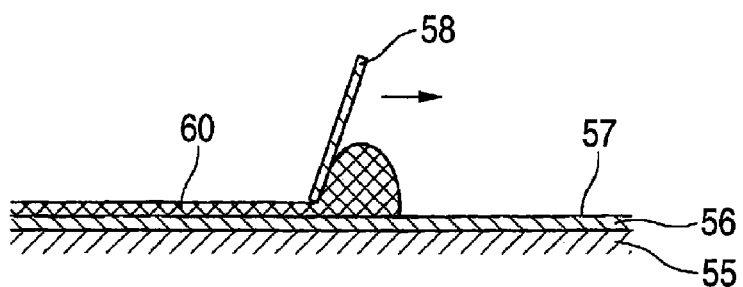
FIGS. 11A to 11D are application process views showing applying an adhesive to terminals of the FPC.
Figure 11B:
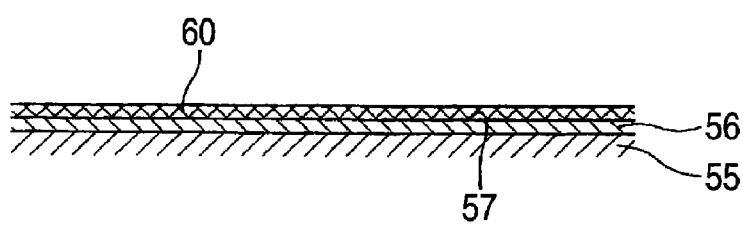
Figure 11C:
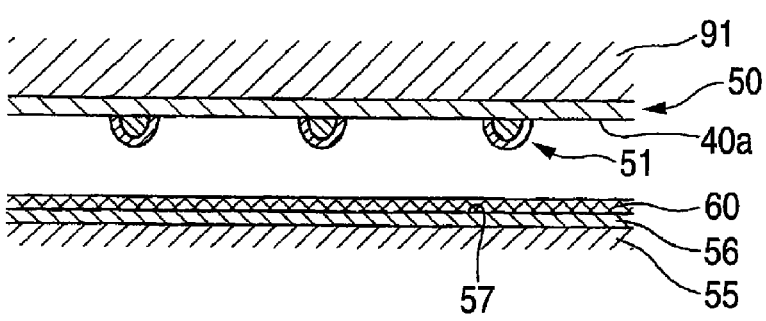
Figure 11D:
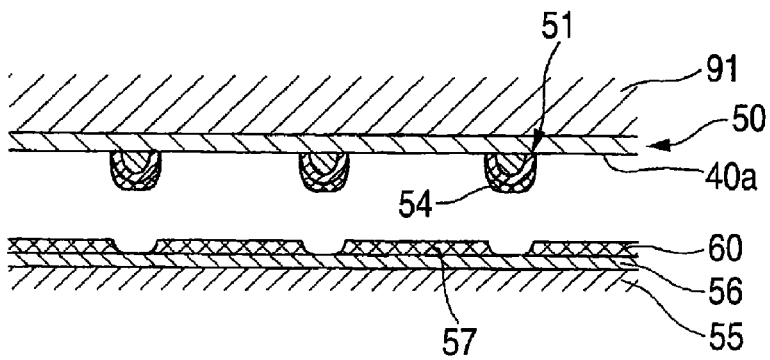

Next, description will be made on a method for applying the thermosetting adhesive 54 to the terminals 51 of the FPC 50. FIGS. 11A to 11D are application process views in which the adhesive is applied to the terminals 51 of the FPC 50. Prior to application of the thermosetting adhesive 54 to the terminals 51 of the FPC 50, first, in Step 13 (S13), a thermosetting adhesive layer 60 having a uniform thickness is formed on a resin sheet (plate material) 56 (forming an adhesive layer). As shown in FIG. 11A, a large amount of a thermosetting adhesive is disposed on a flat upper surface 57 of the resin sheet 56 mounted on a stage 55. A squeegee 58 is then moved from left to right in FIG. 1A. Consequently, as shown in FIG. 11B, the thermosetting adhesive layer 60 having a predetermined thickness is formed on the resin sheet 56. In this event, the thermosetting adhesive layer 60 is formed so that its thickness is slightly smaller than the projecting height of the terminals 51 from the lower surface 40a of the cover film 40. In Step 14 (S14), as shown in FIG. 11C, the FPC 50 is sucked on a suction portion 91, and then disposed so that the terminals 51 face the thermosetting adhesive layer 60.

Next, in Step 15 (S15), the suction portion 91 is moved to approach the stage 55 till the tips of the terminals 51 abut against the resin sheet 56. Thus, the terminals 51 are soaked in the thermosetting adhesive layer 60. As shown in FIG. 1D, the suction portion 91 is moved to leave the stage 55 so that the terminals 51 are separated from the thermosetting adhesive layer 60. Thus, the thermosetting adhesive 54 is applied to the terminals 51 (adhesive application step). In this event, the thickness of the thermosetting adhesive layer 60 is slightly smaller than the height of the terminals 51. Therefore, a gap is formed between the lower surface 40a of the cover film 40 (FPC 50) and the thermosetting adhesive layer 60 though the terminals 51 have been soaked in the thermosetting adhesive layer 60. As a result, the thermosetting adhesive of the thermosetting adhesive layer 60 is prevented from adhering to the lower surface of the FPC 50, that is, the lower surface 40a of the cover film 40.

The aforementioned process from Step 8 to Step 15 may be performed prior to or in parallel with the forming of the channel unit 4 and the actuator units 21.

Figure 12A:
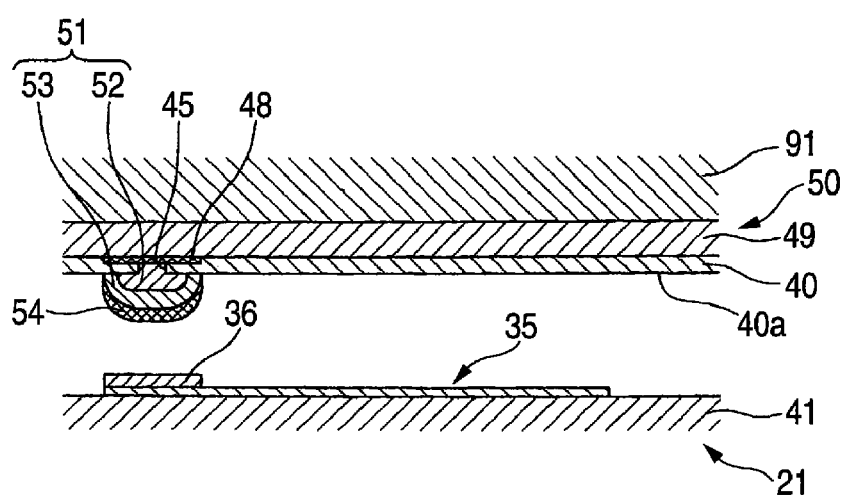
FIGS. 12A to 12C are bonding process views showing bonding between a head body and the FPC.
Figure 12B:
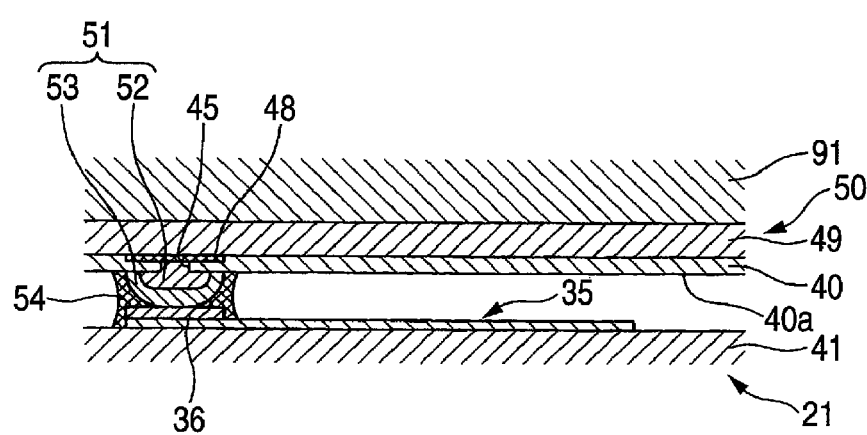
Figure 12C:
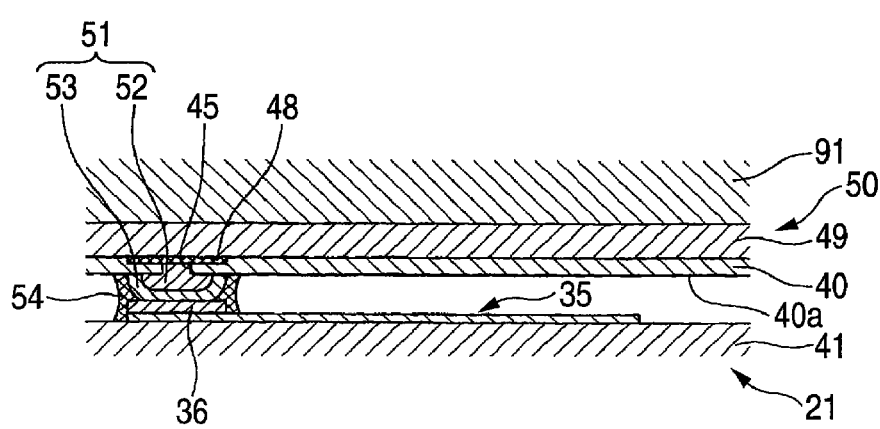

Subsequently, description will be made on a process for bonding the head body 70 and the FPC 50. FIGS. 12A to 12C are process views in which the head body 70 and the FPC 50 are bonded with each other. To bond each actuator unit 21 of the head body 70 with the FPC 50, in Step 16 (S16), as shown in FIG. 12A, the FPC 50 retained by the suction portion 91 is positioned so that the lands 36 face the terminals 51.

Next, in Step 17 (S17), as shown in FIG. 12B, the suction portion 91 is moved downward so as to press each terminal 51 onto its corresponding land 36. At the same time, the FPC 50 and the head body 70 are heated by a not-shown heating apparatus so as to temporarily bond the terminals 51 with the lands 36 (bonding step). At this pressing time, the thermosetting adhesive 54 applied to the surface of the terminal 51 moves to surround the terminal 51 and the land 36 as shown in FIG. 12B. At the heating time, the FPC 50 and the head body 70 are heated to a temperature equal to or higher than the curing temperature of the thermosetting adhesive 54 and lower than the melting points of the solder layer 53 and the core 52 of the terminal 51, for example, to 200° C. The temperature is kept constant for a predetermined time. As a result, the solder layer 53 of the terminal 51 is softened so that the solder layer 53 is deformed from the state shown in FIG. 12B to the state shown in FIG. 12C. Accordingly, the contact area between the terminal 51 and the land 36 increases. Further, in this state, the thermosetting adhesive 54 surrounding the terminal 51, the land 36 and the solder layer 53 is cured. In this event, the FPC 50 has flexibility. Even when the ratio of the height of the core 52 to the thickness of the solder layer 53 is the upper limit value 2:1, all the terminals 51 approach the lands 36 and abut against the lands 36 due to the softening of the solder layer 53 and the bending of the FPC 50. Thus, when the FPC 50 and the actuator unit 21 are cooled naturally in Step 18 (S18) where a predetermined time has passed, the terminals 51 and the lands 36 are electrically connected with each other, and the actuator unit 21 and the FPC 50 are bonded with each other by the thermosetting adhesive 54.

After that, the aforementioned inkjet head 1 is finished after the bonding step of the base block 71 and so on. Optionally if appropriate, the FPC 50 may be bonded in the aforementioned manner, with the actuator unit 21, which has not yet been bonded with the channel unit 4.

In the method for manufacturing bonded substrates according to the first embodiment as described above, the terminals 51 of the FPC 50 are formed so that the ratio of the height of the core 52 and the thickness of the solder layer 53 in each terminal 51 is in a range of from 1:1 to 2:1. Accordingly, even when there is a certain degree of variation in the height of the tip of each core 52 from the lower surface 40a of the FPC 50, the range of the variation in the height of the tip of each core 52 and the range of variation in the height of the tip of each terminal 51 from the lower surface 40a of the FPC 50 overlap each other only slightly. Thus, when each terminal 51 is bonded with its corresponding land 36, the terminal 51 and the land 36 can be electrically bonded with each other surely by the effect of absorbing variation in the thickness direction of the FPC 50 due to the softening of the solder layer 53 and the bending of the FPC 50. In addition, there is no fear that height of the core 52 is smaller than the thickness of the solder layer 53. Thus, the close adhesion between the core 52 and the solder layer 53 is secured. Further, the heating temperature to bond the FPC 50 with the actuator unit 21 is lower than the melting point of the solder layer 53. Accordingly, the solder layer 53 is not melted into a liquid state but softened. Thus, the contact area between the land 36 and the terminal 51 increases while the solder layer 53 hardly protrudes out of an area surrounded by the thermosetting adhesive 54. It is therefore possible to prevent a short-circuit between individual electrodes due to electric connection between the terminals 51. In addition, since the thermosetting adhesive 54 surrounding the terminals 51, the lands 36 and the solder layers 53 is cured, the bonding force between each terminal 51 and its corresponding land 36 is improved.

When the ratio of the core height to the solder layer thickness is set at 1.5:1 within the range of from 1:1 to 1.8:1, the terminals 51 and the lands 36 abut against each other more surely. This is because the variation range of the core height and the variation range of the terminal height are prevented from overlapping each other, so that the terminals 51 and the lands 36 can abut against each other surely even without flexibility of the FPC 50. In other words, the FPC 50 has flexibility in this embodiment so that the terminals 51 and the lands 36 are always electrically bonded due to addition of the effect of the flexibility. Further, even if Pb-free solder having a higher melting point than Pb-containing solder is used for the solder layer 53, the terminals 51 and the lands 36 can be electrically connected surely. The FPC 50 formed in the aforementioned manufacturing method has the aforementioned advantage because the ratio of the height of the core 52 to the thickness of the solder layer 53 in each terminal 51 is in a range of from 1:1 to 2:1.

Figure 13:
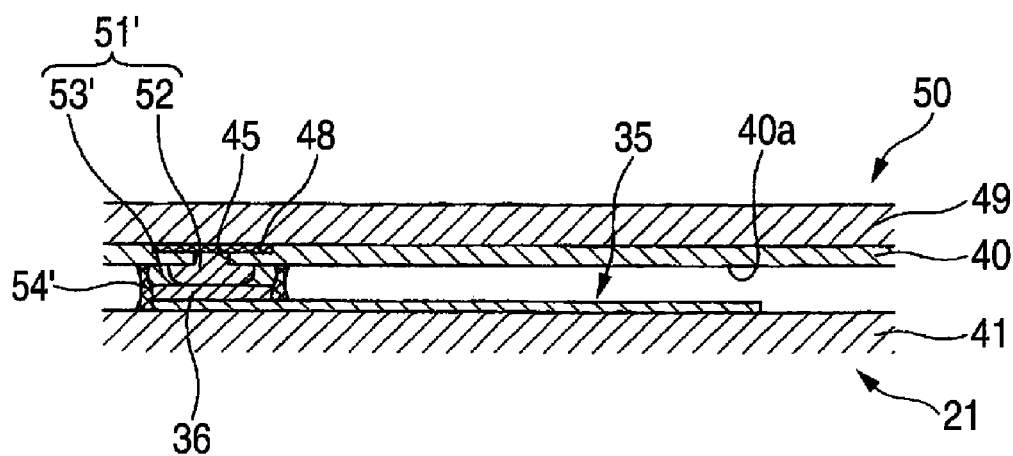
FIG. 13 is a partially sectional view of an inkjet head manufactured by a manufacturing method for manufacturing bonded substrates according to a second embodiment of the invention.

Next, description will be made below on a method for manufacturing bonded substrates according to a second embodiment. FIG. 13 is a partially sectional view of an inkjet head manufactured in the method for manufacturing bonded substrates according to the second embodiment. In the same manner as in the first embodiment, the bonded substrates in this embodiment designates a structure in which an FPC 50 functioning as a first substrate and actuator units 21 functioning as a second substrate are bonded. The manufacturing method of this embodiment is the same as the method for manufacturing bonded substrates according to the first embodiment, except that heating conditions for bonding terminals 51' and lands 36. Parts similar to those in the first embodiment are referenced correspondingly, and description thereof will be omitted.

When the terminals 51' of the FPC 50 are bonded with the lands 36 of the actuator unit 21 in this embodiment, the terminals 51' coated with a thermosetting adhesive 54' are aligned to face the lands 36 in the same manner as in the first embodiment. The suction portion 91 is moved downward so as to press each terminal 51' onto its corresponding land 36. At the same time, the FPC 50 and the head body 70 are heated by a not-shown heating apparatus. The pressing is performed in the same manner as in the first embodiment, but the heating temperature in the heating is different from that in the first embodiment. That is, in this embodiment, the FPC 50 and the head body 70 are heated to a temperature equal to or higher than the melting point of a solder layer 53' and lower than the melting point of the core 52, for example, to 220° C. When the FPC 50 and the head body 70 are heated thus, the solder layer 53' of each terminal 51' is melted so that integration of the core 52 and the land 36 is accelerated as shown in FIG. 13. In this event, the thermosetting adhesive 54' is present around the solder layer 53'. Accordingly, the molten solder layer 53' hardly adheres to another adjacent terminal 51'. The FPC 50 and the head body 70 are heated at 220° C. for a predetermined time. Thus, the thermosetting adhesive 54' progresses to curing.

Next, the FPC 50 and the actuator unit 21 are cooled naturally after a predetermined time has passed. Thus, the terminals 51' and the lands 36 are electrically connected with each other by the solder layer 53'. Further, the FPC 50 and the actuator unit 21 are bonded with each other by the thermosetting adhesive 54'.

As described above, in the method for manufacturing the bonded substrates according to the second embodiment, similar advantages can be obtained in a portion having a similar configuration to that of the first embodiment. Further, due to the molten solder layer 53', the contact area between each terminal 51' and its corresponding land 36 increases in comparison with that in the first embodiment. When the molten solder layer 53' is cured, the bonding force between the terminal 51' and the land 36 is enhanced more. In addition, when the terminal 51' and the land 36 are bonded with each other, the solder layer 53' is melted so that the effect of absorbing variation due to the softening of the solder layer 53' becomes greater. Accordingly, the terminal 51' and the land 36 can be bonded with each other better.

Figure 14:
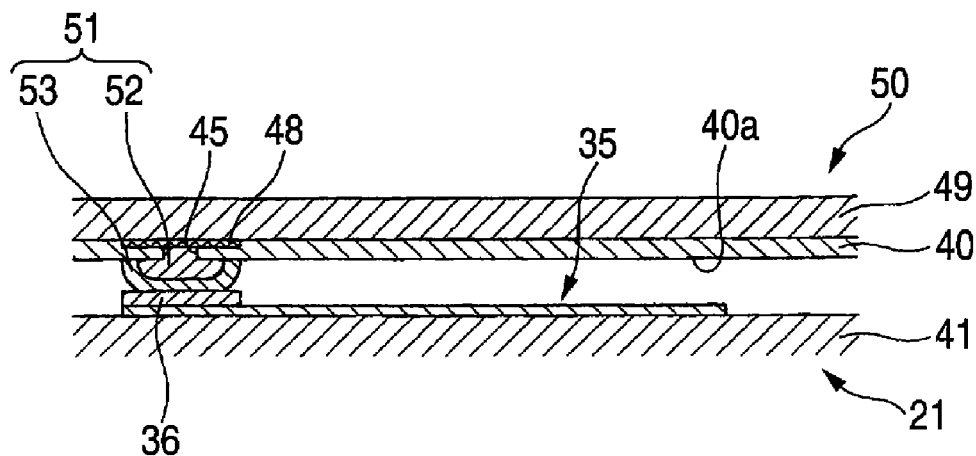
FIG. 14 is a partially sectional view of an inkjet head manufactured by a method for manufacturing bonded substrates according to a modification of the first embodiment of the invention.

Although the terminals 51, 51' are coated with the thermosetting adhesive 54, 54' in each of the aforementioned embodiments, the terminals 51 and the lands 36 may be bonded without applying the thermosetting adhesive thereto, as shown in FIG. 14. In this modification, the terminals 51 in the first embodiment are not coated with the thermosetting adhesive but bonded with the lands 36 substantially in the same manner as in the first embodiment. In this case, the solder layer 53 is not heated to its melting point. Thus, the solder layer 53 is hardly melted to flow and stretch to its surroundings. Since this modification is almost the same as the first embodiment, almost the same advantages can be obtained. In this modification, the solder layer 53 is heated to a temperature lower than its melting point so as not to melt the solder layer 53. However, the solder layer 53 may be heated to a temperature equal to or higher than the melting point of the solder layer 53 and lower than the melting point of the core 52, so that the solder layer 53 can be melted. In this case, the thermosetting adhesive 54' shown in FIG. 13 is not formed. Thus, the contact area between the solder layer 53 and the land 36 is increased so that the bonding force between the terminal 51 and the land 36 is enhanced.

The embodiments of the present invention have been described above. However, the invention is not limited to the aforementioned embodiments. Various changes can be made on the invention without departing from the scope of claims. For example, in each of the aforementioned embodiments, the terminals 51, 51' of the FPC 50 are coated with the thermosetting adhesive 54, 54', and bonded with the lands 36 of the actuator unit 21. However, the terminals 51, 51' of the FPC 50 coated or not coated with the thermosetting adhesive may be bonded with the lands 36 coated with the thermosetting adhesive. Although the FPC 50 is moved to approach the actuator unit 21 so as to press the terminals 51, 51' onto the lands 36, the actuator unit 21 may be moved to approach the FPC 50 so as to press the lands 36 onto the terminals 51, 51'. Although each terminal 51 includes the solder layer 53, which is 13.3-20 μm thick, this is applied only to the case where the terminal is 40 μm high. When the terminal height is changed desirably, the thickness range of the solder layer 53 can be changed suitably. In this case, the thickness of the solder layer 53 is set so that the ratio of the changed core height to the changed solder layer thickness is in a range of from 1:1 to 2:1. Further, the core 52 may be made of metal other than nickel. The solder layer 53, 53' may be of Pb-containing solder (tin-lead: SnPb) Moreover, the method for manufacturing bonded substrates according to each embodiment is applicable to various fields other than inkjet heads.

What is claimed is:

1. A method for manufacturing bonded substrates of a line head printer, in which a plurality of first terminals formed on a first substrate are electrically bonded to a plurality of second terminals formed on a second substrate, the method comprising:

forming the first terminals on the first substrate, each of the first terminals having a metal core projecting from a surface of the first substrate, each metal core coated with a solder layer, the solder layer being lower in melting point than the metal core;

forming the conductive second terminals on the second substrate;

electrically bonding the first terminals to the second terminals by heating the first substrate and the second substrate while applying pressure to the first substrate and the second substrate; and applying a thermosetting adhesive to at least either of the first terminals and the second terminals, wherein: in the forming of the first terminals, a ratio of a height of the metal core from the surface of the first substrate in a thickness direction of the first substrate to a thickness of the solder layer in the thickness direction of the first substrate is in a range of from 1:1 to 2:1, wherein the electrically bonding of the first terminals to the second terminals comprises: heating the first substrate and the second substrate at a temperature, which is equal to or higher than the melting point of the solder layer and is lower than the melting point of the metal core, while applying the pressure to the first substrate and the second substrate, and wherein after the applying of the thermosetting adhesive, the first terminals are electrically bonded to the second terminals by heating the first substrate and the second substrate at a temperature, which is (i) equal to or higher than a curing temperature of the thermosetting adhesive, (ii) equal to or higher than the melting point of the solder layer and (iii) lower than the melting point of the metal core, while applying the pressure to the first substrate and the second substrate.

2. The method according to claim 1, wherein the first substrate has flexibility.

3. The method according to claim 1, wherein in the forming of the first terminals, the ratio of the height of the metal core from the surface of the first substrate in the thickness direction of the first substrate to the thickness of the solder layer in the thickness direction of the first substrate is in a range of from 1:1 to 1.8:1.

4. The method according to claim 1, wherein in the forming of the first terminals, the thickness of the solder layer is in a range of from 13.3 μm to 20 μm.

5. The method according to claim 1, wherein the solder layer comprises Pb free solder.

6. The method according to claim 1, wherein the metal core comprises nickel.

7. The method according to claim 1, wherein the height of the metal core is equal to one half of a result of a width of the metal core minus a width of the opening in the first substrate through which the metal core protrudes.

8. The method according to claim 1, wherein the thickness of the solder layer is equal to a quotient minus the height of the metal core, wherein the quotient equals a width of the metal core and the solder layer minus a width of the opening in the first substrate through which the metal core protrudes divided by two.

* * * * *